(12) United States Patent
Mui et al.

(10) Patent No.: US 8,084,406 B2
(45) Date of Patent: Dec. 27, 2011

(54) APPARATUS FOR PARTICLE REMOVAL BY SINGLE-PHASE AND TWO-PHASE MEDIA

(75) Inventors: David S. L. Mui, Fremont, CA (US);
Satish Srinivasan, Fremont, CA (US);
Grant Peng, Fremont, CA (US); Ji Zhu,
El Cerrito, CA (US); Shih-Chung Kon,
San Jose, CA (US); Dragan Podlesnik,
Palo Alto, CA (US); Arjun Mendiratta,
Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 557 days.

(21) Appl. No.: 12/131,667

(22) Filed: Jun. 2, 2008

(65) Prior Publication Data

US 2009/0151757 A1    Jun. 18, 2009

Related U.S. Application Data

(60) Provisional application No. 61/013,950, filed on Dec. 14, 2007.

(51) Int. Cl.
*C11D 17/00* (2006.01)
(52) U.S. Cl. ......... 510/109; 134/902
(58) Field of Classification Search ........ 134/94.1, 134/99.1, 100.1, 902; 510/109
See application file for complete search history.

(56) References Cited

U.S. PATENT DOCUMENTS

| | | | | |
|---|---|---|---|---|
| 3,994,744 A | * | 11/1976 | Anderle et al. | 134/4 |
| 4,002,571 A | * | 1/1977 | Anderle et al. | 252/90 |
| 4,130,498 A | * | 12/1978 | Lee et al. | 252/99 |
| 4,533,399 A | * | 8/1985 | Mencke | 134/6 |
| 4,613,379 A | * | 9/1986 | Su et al. | 134/7 |
| 4,725,319 A | * | 2/1988 | Osberghaus | 134/4 |
| 4,839,082 A | * | 6/1989 | Bhatia | 252/174.12 |
| 5,534,167 A | * | 7/1996 | Billman | 510/280 |
| 5,750,031 A | * | 5/1998 | Rahman et al. | 210/681 |

(Continued)

FOREIGN PATENT DOCUMENTS

DE    10063427    * 7/2002

(Continued)

OTHER PUBLICATIONS

Golden et al.; Evaluating and Treating CMP Wastewater; Oct. 1, 2000; www.semiconductor.net.*

*Primary Examiner* — Frankie L Stinson
(74) *Attorney, Agent, or Firm* — Martine Penilla Group, LLP

(57) ABSTRACT

The embodiments of the present invention provide apparatus for cleaning patterned substrates with fine features with cleaning materials. The apparatus using the cleaning materials has advantages in cleaning patterned substrates with fine features without substantially damaging the features. The cleaning materials are fluid, either in liquid phase, or in liquid/gas phase, and deform around device features; therefore, the cleaning materials do not substantially damage the device features or reduce damage all together. The cleaning materials containing polymers of a polymeric compound with large molecular weight capture the contaminants on the substrate. In addition, the cleaning materials entrap the contaminants and do not return the contaminants to the substrate surface. The polymers of one or more polymeric compounds with large molecular weight form long polymer chains, which can also be cross-linked to form a network (or polymeric network). The long polymer chains and/or polymer network show superior capabilities of capturing and entrapping contaminants, in comparison to conventional cleaning materials.

11 Claims, 17 Drawing Sheets

U.S. PATENT DOCUMENTS

| | | | | |
|---|---|---|---|---|
| 5,770,548 | A * | 6/1998 | Leskowicz et al. | 510/181 |
| 5,779,811 | A | 7/1998 | Machii et al. | 134/4 |
| 5,955,414 | A | 9/1999 | Brown et al. | 510/279 |
| 6,050,283 | A * | 4/2000 | Hoffman et al. | 137/3 |
| 6,120,175 | A * | 9/2000 | Tewell | 366/140 |
| 6,165,970 | A | 12/2000 | Williams et al. | 510/480 |
| 6,200,414 | B1 * | 3/2001 | Hwang et al. | 156/345.18 |
| 6,340,663 | B1 | 1/2002 | Deleo et al. | 510/438 |
| 6,384,109 | B1 * | 5/2002 | Witecki, Jr. | 523/348 |
| 6,462,013 | B1 | 10/2002 | Cooke, Jr. et al. | 510/475 |
| 6,525,009 | B2 | 2/2003 | Sachdev et al. | 510/175 |
| 6,530,383 | B1 | 3/2003 | Rogmann et al. | 134/25.2 |
| 6,607,424 | B1 | 8/2003 | Costas et al. | 451/41 |
| 6,620,209 | B2 | 9/2003 | Kischkel et al. | 8/137 |
| 6,703,358 | B1 | 3/2004 | Aubay et al. | 510/434 |
| 6,733,538 | B1 | 5/2004 | Panandiker et al. | 8/137 |
| 6,812,194 | B2 | 11/2004 | Ruhr et al. | 510/202 |
| 6,977,222 | B2 | 12/2005 | Mori | |
| 7,022,193 | B2 * | 4/2006 | Jeong et al. | 134/30 |
| 7,074,750 | B2 | 7/2006 | Hamers et al. | 510/400 |
| 7,084,097 | B2 | 8/2006 | Ishikawa et al. | |
| 7,238,752 | B2 | 7/2007 | Song | 525/344 |
| 7,255,749 | B2 | 8/2007 | Inagaki et al. | 134/18 |
| 7,281,840 | B2 * | 10/2007 | Simpson et al. | 366/132 |
| 7,297,673 | B2 | 11/2007 | Collin et al. | 510/475 |
| 2002/0108641 | A1 * | 8/2002 | Lee et al. | 134/30 |
| 2002/0111033 | A1 | 8/2002 | Wu et al. | |
| 2002/0112741 | A1 * | 8/2002 | Pieroni et al. | 134/6 |
| 2003/0004075 | A1 | 1/2003 | Suto et al. | |
| 2003/0087795 | A1 | 5/2003 | Wood et al. | |
| 2003/0109394 | A1 | 6/2003 | Ruhr et al. | 510/202 |
| 2003/0119689 | A1 | 6/2003 | Hutton et al. | 510/218 |
| 2003/0207777 | A1 | 11/2003 | Naghshineh et al. | |
| 2004/0003828 | A1 | 1/2004 | Jackson | |
| 2004/0011386 | A1 * | 1/2004 | Seghal | 134/26 |
| 2004/0048761 | A1 | 3/2004 | Ikemoto | |
| 2005/0176606 | A1 | 8/2005 | Konno et al. | 510/175 |
| 2006/0128590 | A1 | 6/2006 | Freer et al. | |
| 2006/0128600 | A1 | 6/2006 | Freer et al. | |
| 2006/0186089 | A1 * | 8/2006 | Shida et al. | 216/88 |
| 2007/0129278 | A1 | 6/2007 | Christmas | 510/421 |
| 2007/0179265 | A1 | 8/2007 | Albers et al. | 526/286 |
| 2007/0256247 | A1 | 11/2007 | Privitera et al. | |

FOREIGN PATENT DOCUMENTS

| | | | |
|---|---|---|---|
| EP | 0467472 | * | 1/1992 |
| EP | 1661975 | * | 5/2006 |
| GB | 2228944 | * | 9/1990 |
| JP | 403239800 | * | 10/1991 |
| WO | WO 99/66004 | | 12/1999 |

* cited by examiner

APPARATUS FOR PARTICLE REMOVAL BY SINGLE-PHASE AND TWO-PHASE MEDIA

CLAIM OF PRIORITY

This application claims priority under 35 U.S.C. 119(e) to U.S. Provisional Patent Application No. 61/013,950, filed Dec. 14, 2007, entitled "Materials and Methods for Particle Removal by Single-Phase and Two-Phase Media." This provisional application is incorporated herein by reference.

CROSS REFERENCE TO RELATED APPLICATIONS

This application is related to U.S. patent application Ser. No. 12/131,654, filed on the same day as this application, entitled "Apparatus for Particle Removal by Single-Phase and Two-Phase Media." This application is related to U.S. patent application Ser. No. 12/131,660, filed on the same day as this application, entitled "Methods for Particle Removal by Single-Phase and Two-Phase Media." This application is also related to U.S. patent application Ser. No. 11/532,491, filed on Sep. 15, 2006, entitled "Method and Material for Cleaning a Substrate," U.S. patent application Ser. No. 11/532,493, filed on Sep. 15, 2006, entitled "Apparatus and System for Cleaning a Substrate," and U.S. patent application Ser. No. 11/641,362, filed on Dec. 18, 2006, entitled "Substrate Preparation Using Stabilized Fluid Solutions and Methods for Making Stable Fluid Solutions." The disclosure of each of the above-identified related applications is incorporated herein by reference.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contaminants from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical forces on the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

In view of the forgoing, there is a need for apparatus and methods of cleaning patterned wafers that are effective in removing contaminants and do not damage the features on the patterned wafers.

SUMMARY

Broadly speaking, the embodiments of the present invention provide improved materials, apparatus, and methods for cleaning wafer surfaces, especially surfaces of patterned wafers (or substrates). The cleaning materials, apparatus, and methods discussed above have advantages in cleaning patterned substrates with fine features without substantially damaging the features. The cleaning materials are fluid, either in liquid phase, or in liquid/gas dual phase, and deform around device features; therefore, the cleaning materials do not substantially damage the device features or reduce damage all together. The cleaning materials, containing polymers of one or more polymeric compounds with large molecular weight, capture the contaminants on the substrate. For polymers made from one monomer, the polymers contain one polymeric compound. For polymers made from more than one monomers, such as copolymers or a mixture of polymers, the polymers contain more than one polymeric compounds.

In addition, the cleaning materials entrap the contaminants and do not return the contaminants to the substrate surface. The polymers of a polymeric compound with large molecular weight form long polymer chains, which can also be cross-linked to form a network (or polymeric network). The length of the polymer chains for polymers that are not substantially cross-linked or almost not cross-linked can be estimated by dividing the molecular weight of the polymers by the molecular weight of the monomeric species (length~(molecular weight of polymer)/(weight of monomer)). The long polymer chains and/or polymer network show superior capabilities of capturing and entrapping contaminants, in comparison to conventional cleaning materials. As a result, cleaning materials, in fluid form, including such polymers show excellent particle removal performance. The captured or entrapped contaminants are then removed from the surface of the substrate.

As discussed above, the polymers can be cross-linked. However, the extent of cross-link is relatively limited to avoid making the polymers too hard or rigid, which would prevent the polymers from being soluble in a solvent and being deformed around device features on the substrate surface.

It should be appreciated that the present invention can be implemented in numerous ways, including as a system, a method and a chamber. Several inventive embodiments of the present invention are described below.

In one embodiment, a cleaning system for removing contaminants on a surface of a patterned substrate for defining integrated circuit devices is provided. The cleaning system includes a substrate carrier for supporting edges of the patterned substrate. The cleaning system also includes a cleaning head positioned over the patterned substrate held by the substrate carrier, the cleaning head having a plurality of dispensing holes to dispense a cleaning material on the surface the patterned substrate for defining integrated circuit devices. The cleaning material includes polymers of the polymeric compound with a molecular weight greater than 10,000 g/mol. The polymers are soluble in a solvent to form the cleaning material. The cleaning material has less than 1 part per billion (ppb) of metallic contaminants before being applied on the surface of the patterned substrate.

The solubilized polymers have long polymer chains to capture and entrap the contaminants from the surface of the patterned substrate. The cleaning material deforms around device features on the patterned substrate when a force is applied on the cleaning material applied on the surface of the patterned substrate to remove the contaminants without substantially damaging the device features on the surface. The cleaning material is substantially free of abrasive particles before the cleaning material being applied on the surface of the patterned substrate. The cleaning head being coupled to a storage of the cleaning material, which is coupled to the cleaning material preparation system. Further, the cleaning system includes a support structure for holding the cleaning head in proximity to the surface of the patterned substrate.

In another embodiment, a cleaning system for dispensing a cleaning material to remove contaminants on a surface of a patterned substrate for defining integrated circuit devices is provided. The cleaning system includes a substrate support for supporting the patterned substrate. The substrate support rotates during a cleaning process to remove contaminants from the surface of the patterned substrate. The cleaning system also includes a dispensing nozzle positioned over the patterned substrate for dispensing the cleaning material on the patterned substrate for defining integrated circuit devices. The cleaning material includes polymers of the polymeric compound with a molecular weight greater than 10,000 g/mol. The polymers are soluble in a solvent to form the cleaning material. The cleaning material has less than 1 ppb metallic contaminants before being applied on the surface of the patterned substrate.

The solubilized polymers have long polymer chains to capture and entrap the contaminants from the surface of the patterned substrate. The cleaning material deforms around device features on the patterned substrate when a force is applied on the cleaning material applied on the surface of the patterned substrate to remove the contaminants without substantially damaging the device features on the surface. The cleaning material is substantially free of abrasive particles before the cleaning material being applied on the surface of the patterned substrate. The dispensing head is coupled to a storage of the cleaning material, which is coupled to the cleaning material preparation system.

In another embodiment, a cleaning system for removing contaminants on a surface of a patterned substrate for defining integrated circuit devices is provided. The cleaning system includes a substrate carrier for supporting the patterned substrate. The cleaning material also includes a cleaning tank containing the cleaning material for removing contaminants from the surface of the patterned substrate for defining integrated circuit devices. the cleaning material includes polymers of the polymeric compound with a molecular weight greater than 10,000 g/mol. The polymers is soluble in a solvent to form the cleaning material. The cleaning material has less than 1 ppb metallic contaminants before being applied on the surface of the patterned substrate.

The solubilized polymers have long polymer chains to capture and entrap the contaminants from the surface of the patterned substrate. The cleaning material deforms around device features on the patterned substrate when a force is applied on the cleaning material applied on the surface of the patterned substrate to remove the contaminants without substantially damaging the device features on the surface. The cleaning material is substantially free of abrasive particles before the cleaning material being applied on the surface of the patterned substrate. The dispensing head is coupled to a storage of the cleaning material. Further, the cleaning system has a mechanical mechanism for lowering the patterned substrate into the cleaning tank.

In another embodiment, a cleaning material preparation system is provided. The cleaning material preparation system includes a polymer container, which contains polymers, and a solvent container, which contains a solvent. The cleaning material preparation system also includes a container for buffering agent, which contains a buffering agent. The cleaning material preparation system further includes a mixing container for mixing the polymers, the solvent, and the buffering agent to prepare the cleaning material. The mixing container is coupled to the polymer container, the solvent container, and the container for the buffering agent. The cleaning material is for removing contaminants on a surface of a patterned substrate for defining integrated circuit devices. The cleaning material includes polymers of the polymeric compound with a molecular weight greater than 10,000 g/mol, the polymers being soluble in a solvent to form the cleaning material. The cleaning material has less than 1 part per billion (ppb) of metallic contaminants before being applied on the surface of the patterned substrate.

The solubilized polymers have long polymer chains to capture and entrap the contaminants from the surface of the patterned substrate. The cleaning material deforms around device features on the patterned substrate when a force is applied on the cleaning material applied on the surface of the patterned substrate to remove the contaminants without substantially damaging the device features on the surface. The cleaning material is substantially free of abrasive particles before the cleaning material being applied on the surface of the patterned substrate. The mixing container is coupled to a storage of the cleaning material, which is coupled to the cleaning material preparation system.

In yet another embodiment, a cleaning material preparation system is provided. The cleaning material preparation system includes a polymer container, which contains polymers, and a solvent container, which contains a solvent. The cleaning material preparation system also includes a container for buffering agent and additives, which contains a buffer agent and additives for making the cleaning material. The cleaning material preparation system further includes a first mixing container for preparing a first mixture of the polymers, the solvent, the buffer agent, and the additives to make the cleaning material. The mixing container is coupled to the polymer container, the solvent container, and the container for buffering agent and additives. In addition, the cleaning material preparation system includes a purifier, which is a system that purifies the first mixture from the first mixing container. The purifier is coupled to the first mixing container.

Additionally, the cleaning material preparation system includes an adjustment container for preparing the cleaning material by mixing the first mixture with additional buffering agent and additives. The adjustment container is coupled to the purifier. The cleaning material is for removing contaminants on a surface of a patterned substrate for defining integrated circuit devices. The cleaning material includes polymers of the polymeric compound with a molecular weight greater than 10,000 g/mol. The polymers are soluble in a solvent to form the cleaning material. The cleaning material has less than 1 part per billion (ppb) of metallic contaminants before being applied on the surface of the patterned substrate. The solubilized polymers have long polymer chains to capture and entrap the contaminants from the surface of the patterned substrate. The cleaning material deforms around device features on the patterned substrate when a force is applied on the cleaning material applied on the surface of the patterned substrate to remove the contaminants without substantially damaging the device features on the surface. The cleaning material is substantially free of abrasive particles before the cleaning material being applied on the surface of the patterned substrate. The adjustment container is coupled to a storage of the cleaning material, which is coupled to the cleaning material preparation system

BRIEF DESCRIPTION OF THE DRAWINGS

The present invention will be readily understood by the following detailed description in conjunction with the accompanying drawings, and like reference numerals designate like structural elements.

DETAILED DESCRIPTION

Embodiments of materials, methods and apparatus for cleaning wafer surfaces without damaging surface features are described. The cleaning materials, apparatus, and methods discussed herein have advantages in cleaning patterned substrates with fine features without damaging the features. The cleaning materials are fluid, either in liquid phase, or in liquid/gas phase, and deform around device features; therefore, the cleaning materials do not damage the device features. The cleaning materials, containing polymers of a polymeric compound with large molecular weight, capture the contaminants on the substrate. In addition, the cleaning materials entrap the contaminants and do not return the contaminants to the substrate surface. The polymers of a polymeric compound with large molecular weight form long polymer chains, which can also be cross-linked to form a network (or polymeric network). The long polymer chains and/or polymer network show superior capabilities of capturing and entrapping contaminants, in comparison to conventional cleaning materials.

It will be obvious, however, to one skilled in the art, that the present invention may be practiced without some or all of these specific details. In other instances, well known process operations have not been described in detail in order not to unnecessarily obscure the present invention.

The embodiments described herein provide cleaning materials and cleaning methods that are effective in removing contaminants and do not damage the features on the patterned wafers, some of which may contain high aspect ratio features. While the embodiments provide specific examples related to semiconductor cleaning applications, these cleaning applications might be extended to any technology requiring the removal of contaminants from a substrate.

Figure 1:
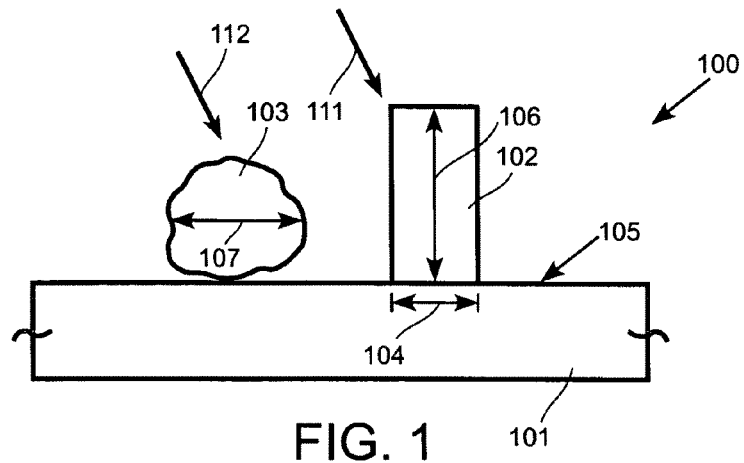
FIG. 1 shows a defect and device feature on a substrate, in accordance with one embodiment of the present invention.

FIG. 1 shows a substrate 100 with a substrate body 101, in accordance with one embodiment of the present invention. On substrate 101 there is a device structure 102 and a particle 103 in the vicinity of surface 105. Particle 103 has an approximate diameter 107, which can be in the same order of magnitude as the width 104 of device structure 102.

For advanced technologies, such as 65 nm, 45 nm, 32 nm, 22 nm, and, 16 nm technology nodes, the width 104 of the device structure 102 is equal to or less than 65 nm. The widths of device structures, such as width 104 of device structure 102, are scaled continuously down with each technology node to fit more devices on the limited surface area of chips. The heights of the device structures, such as height 106 of device structure 102, in general do not scale down proportionally with the width of the device features due to concern of resistivities. For conductive structures, such as polysilicon lines and metal interconnect, narrowing the widths and heights of structures would increase the resistivities too high to cause significant RC delay and generate too much heat for the conductive structures. As a result, device structures, such as structure 102, would have high aspect ratio, which make them prone to damage by force 111 applied on the structure. In one embodiment, the aspect ratio of the device structure can be in the range of about 2 or greater. Force 112 is applied on particle 103 to assist in removing particle 103. Forces 111 and 112 are applied by cleaning material (not shown) on the substrate surface near device structure 102 to remove surface particulates, such as particle 103. In one embodiment, forces 111 and 112 are very close in magnitude, since they are in the vicinity of each other. Forces 111, 112 applied on the substrate surface could be from any relative motion between the cleaning material and the substrate surface. For example, it can be from dispensing of cleaning material or rinsing of the cleaning material.

The decreased width 104 of device structure 102 and the relatively high aspect ratio of device structure 102 make the device structure 102 prone to breakage under applied force 111 or accumulated energy under applied force 111. The damaged device structure 102 becomes a particle source to reduce yield. In addition, the damage device structure 102 also can become inoperable due to the damage.

Figures 2A, 2B:
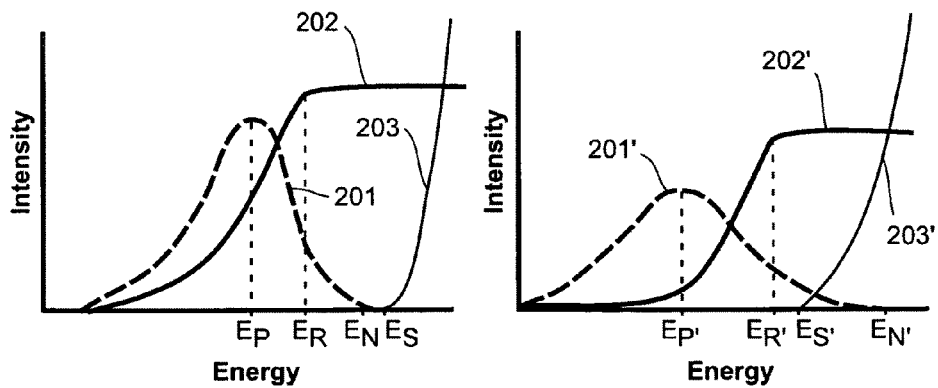
FIG. 2A shows a diagram of 3 response curves related to applying a cleaning material on a patterned substrate, in accordance with one embodiment of the present invention.
FIG. 2B shows a diagram of 3 response curves related to applying a cleaning material on a patterned substrate.

FIG. 2A shows a diagram of 3 response curves related to applying a cleaning material on a patterned substrate, in accordance with one embodiment of the present invention. Curve 201 shows intensity versus energy (as a result of force) exerted by a cleaning material on the substrate surface. The intensity of cleaning energy exerted by the cleaning material peaks at $E_P$. Curve 202 shows particle removal efficiency as a function of energy applied on the substrate by the cleaning material. The particle removal rate peaks at near $E_R$. When the energy exerted by the cleaning material reaches $E_R$, the cleaning material is most efficient at removing particles from the substrate surface. Curve 203 shows the amount of damages of device structures caused by the cleaning material as a function of energy applied on the substrate surface by the cleaning material. The device structures become damaged at $E_S$, which is higher than the higher end, $E_N$, of energy exerted by the cleaning material on the substrate. Since the device structure damage curve 203 is outside the energy distribution 201 of the cleaning material exerts on the pattern substrate, the device structures on the pattern substrate would not be damaged. The particle removal curve 202 shows that the cleaning material can remove particles (or contacts) from the substrate surface without damaging structures on the substrate.

FIG. 2B shows a diagram of 3 response curves related to applying a cleaning material on a patterned substrate. Curve 201' shows intensity versus energy exerted by a cleaning material on a patterned substrate. The intensity exerted by the cleaning material peaks at $E_P'$. Curve 202' shows particle removal rate versus energy applied on the substrate. The particle removal rate peaks at near $E_R'$. When the energy exerted by the cleaning material reaches $E_R'$, the cleaning material is most efficient at removing particles from the substrate surface. Curve 203' shows the amount of damages of device structures caused by the cleaning material as a function of energy applied on the substrate surface by the cleaning material. The device structures on the substrate become damaged at $E_S'$, which is lower than the higher end, $E_N'$, of energy distribution of energy exerted by the cleaning material. Since the device structure damage curve 203' is within the energy distribution 201' of the cleaning material exerts on the pattern substrate, the device structures on the pattern substrate would be damaged by the cleaning material to add particles (or defects).

As mentioned above, damaging device structures during a cleaning process could render the device inoperable and damaged device structures could stay on the substrate surface to reduce device yield. Therefore, the relationship between the cleaning curve 201' and damage curve 203' of FIG. 2B is undesirable. In contrast, the relationship between the cleaning curve 201 and damage curve 203 of FIG. 2A is desirable.

Conventional substrate cleaning apparatus and methods include brushes and pads utilizing mechanical forces in removing particulates from the substrate surface. For advanced technologies with device structures with narrow widths and high aspect ratios, the mechanical forces applied by the brushes and pads can damage the device structures. In addition, the harsh brushes and pads may also cause scratches on the substrate surface. Cleaning techniques, such as megasonic cleaning and ultrasonic cleaning, utilizing cavitation bubbles and acoustic streaming to clean substrate can also damage fragile structures. Cleaning techniques using jets and sprays can cause erosion of films and can also damage fragile structures.

Figure 2C:
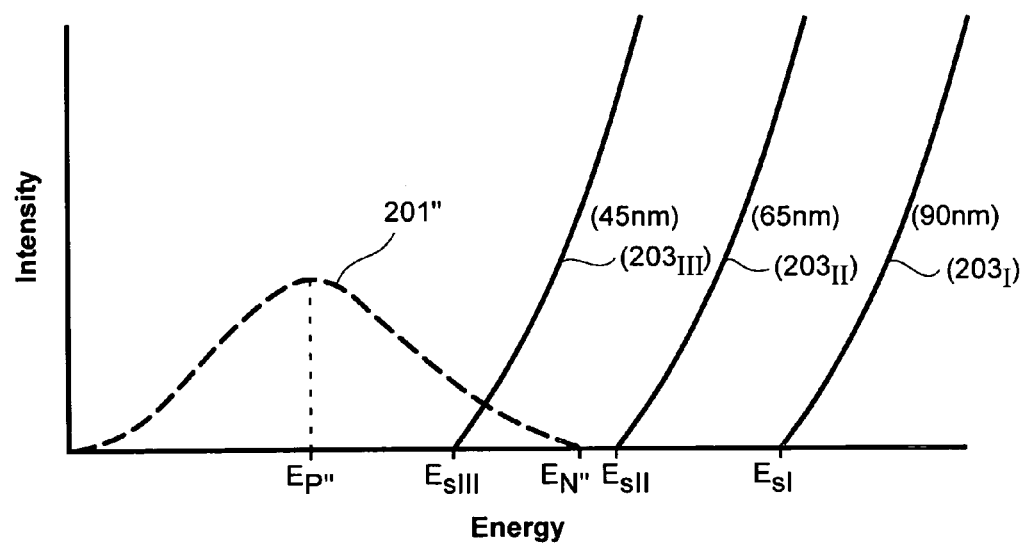
FIG. 2C shows a diagram of 3 damage curves for different technology nodes and a force intensity curve of a cleaning material, in accordance with one embodiment of the present invention.

FIG. 2C shows a cleaning curve 201" for a conventional cleaning material applied by a conventional method, such as megasonic clean, in accordance with one embodiment of the present invention. There are damage curves $203_I$, $203_{II}$, and $203_{III}$ for three technology nodes, 90 nm, 65 nm, and 45 nm, respectively. The onset of damage starts at energy $E_{SI}$ for curve $203_I$ for patterned wafers for 90 nm technology node. $E_{SI}$ is larger than the upper end $E_N"$ of energy distribution of the cleaning material on the patterned substrate. Therefore, there is no damage to the device structures. The conventional cleaning material of FIG. 2C still works for 65 nm technology node, since the onset of damage starts at $E_{SII'}$, which is higher than $E_N''$. As technology moves into narrower width, the onset of damage starts at lower energy level. When the technology node becomes 45 nm or lower, the conventional cleaning material and method of curve 201" would cause damage to device structures. The onset of damage for 45 nm technology node, $E_{SIII'}$, is lower than the $E_N''$. FIG. 2C shows that although some cleaning materials and methods work for conventional technologies, they no longer work for advanced technologies with narrower feature widths. Therefore, there is a need to find a cleaning mechanism using a cleaning material that is gentle to the device structure and is effective in removing particles from the substrate surface for advanced technologies.

Figure 3A:
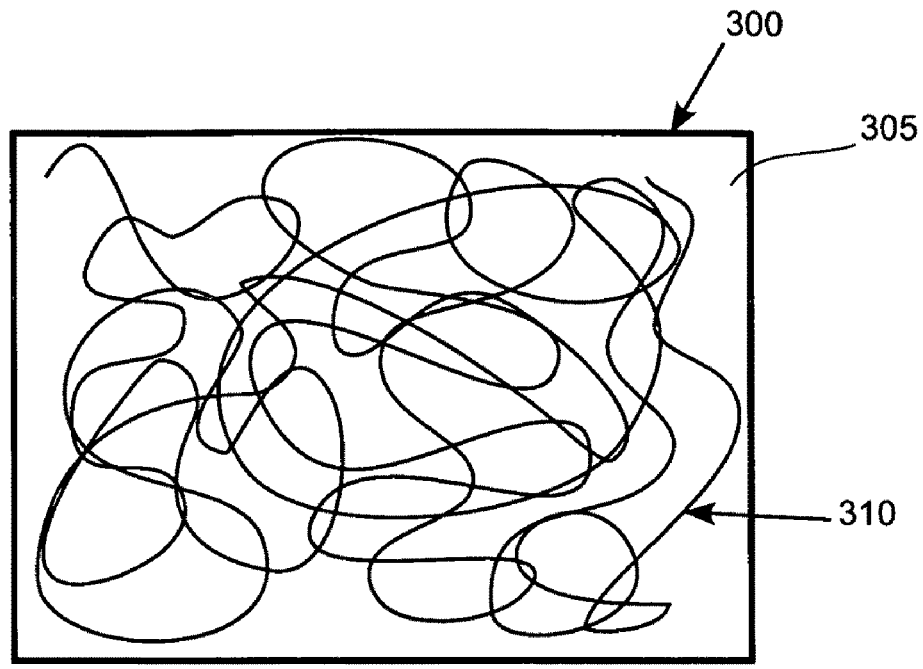
FIG. 3A shows a cleaning material containing polymers of a polymeric compound with large molecular weight dissolved in the cleaning solution, in accordance with one embodiment of the present invention.
Figure 3B:
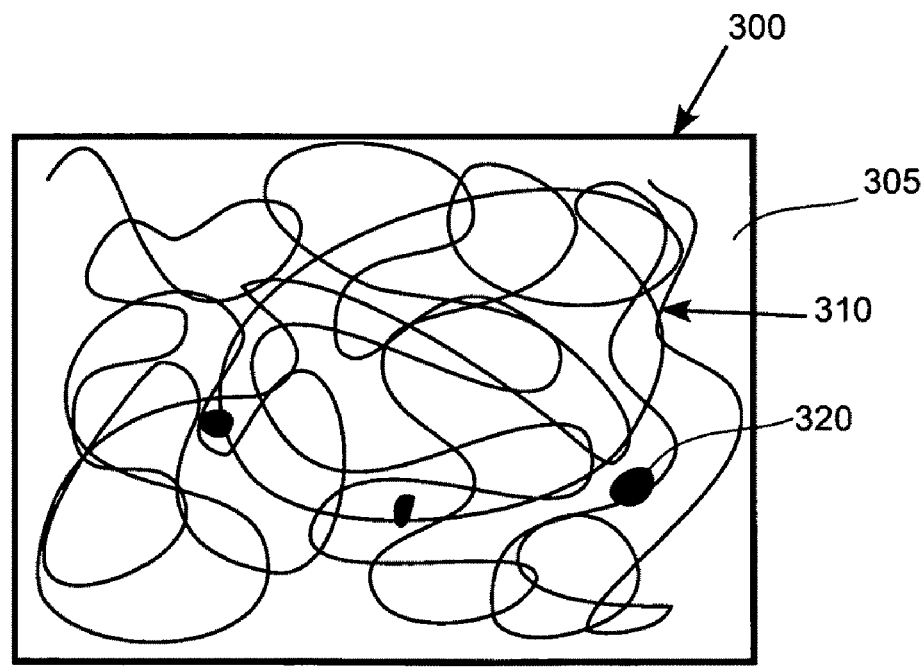
FIG. 3B shows the cleaning material of FIG. 3A entrapping contaminants, in accordance with one embodiment of the present invention.

FIG. 3A shows a liquid cleaning material 300, which contains a cleaning solution 305 containing polymers 310 with large molecular weight dissolved in the cleaning solution 305, in accordance with one embodiment of the present invention. In one embodiment, the liquid cleaning material 300 is a gel. In another embodiment, the liquid cleaning material 300 is a sol. In yet another embodiment, the liquid cleaning material 300 is a liquid solution. The liquid cleaning material 300, when applied on a substrate with particles on the substrate surface, can remove particles on the substrate surface. In one embodiment, the removed particles 320 are attached to the polymers 310, as shown in FIG. 3B. The polymers of a polymeric compound with large molecular weight, such as greater than 10,000 g/mol or 100,000 g/mol, form long polymer chains and polymeric network to capture and trap the removed particles to prevent the particles from returning back to the substrate surface. The polymers dissolve in a cleaning solution, which contains elements that affect the pH value, and enhance the solubility of the polymers. The polymers dissolved in the cleaning solution can be a soft gel or become gel-like droplets suspended in the cleaning solution. In one embodiment, the contaminants on the substrate surface attach to the solvated polymers by ionic force, van der Waals force, electrostatic force, hydrophobic interaction, steric interaction, or chemical bonding when the polymer molecules come in vicinity of the contaminants. The polymers capture and entrap the contaminants.

In one embodiment, the polymers of a polymeric compound with large molecular weight forms a network in the cleaning solution 305. In addition, the polymers of a polymeric compound with large molecular weight are dispersed in the liquid cleaning solution 305. The liquid cleaning material 300 is gentle on the device structures on the substrate during cleaning process. The polymers 310 in the cleaning material 300 can slide around the device structures, such as structure 302, as shown in cleaning volume 330 of FIG. 3C, without making a forceful impact on the device structure 302. In contrast, hard brushes, and pads mentioned above would make unyielding contacts with the device structures and damage the device structures. Forces (or energy) generated by cavitation in megasonic cleaning and high-speed impact by liquid during jet spray can also damage the structure. Alternatively, more than one type of polymer can be dissolved in the cleaning solution to formulate the cleaning material. For examples the polymers in the cleaning material can include an "A" polymeric compound and a "B" polymeric compound.

Figure 3C:
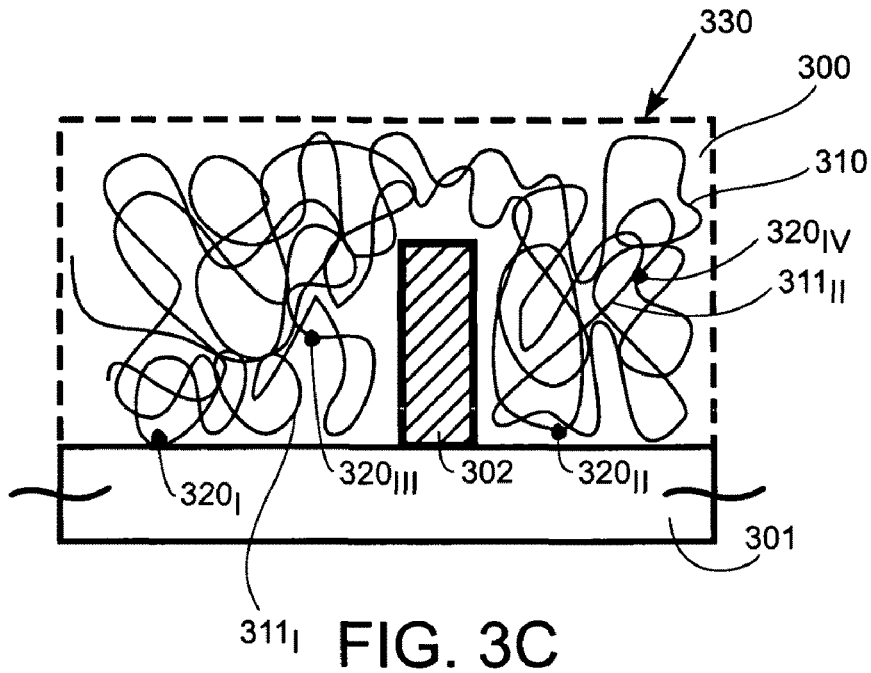
FIG. 3C shows the cleaning material of FIG. 3A dispensed on a patterned wafer to clean contaminants from the substrate surface, in accordance with one embodiment of the present invention.

The polymers of a polymeric compound with high molecular weight form long chains of polymers, with or without cross-linking to from a polymeric network. As shown in FIG. 3C, the polymers 310 come in contact with the contaminants, such as contaminants $320_I$, $320_{II}$, $320_{III}$, $320_{IV}$ on the patterned (or un-patterned) substrate surface and capture contaminants. After the contaminants are captured by the polymers, the contaminants become attached to the polymers and are suspended in the cleaning material. FIG. 3C shows that contaminants $320_{III}$, and $320_{IV}$, which are attached to the polymer chain(s) $311_I$, and $311_{II}$, respectively. Contaminants $320_I$ and $320_{II}$ are attached to other polymer chains. Alternatively, contaminants, $320_I$, $320_{II}$, $320_{III}$, and $320_{IV}$, can each be attached to multiple polymer chains, or be attached to a polymeric network. When the polymers in the cleaning material 300 are removed from the substrate surface, such as by rinsing, the contaminants attached to the polymers chains are removed from the substrate surface along with the polymer chains.

Figure 3D:
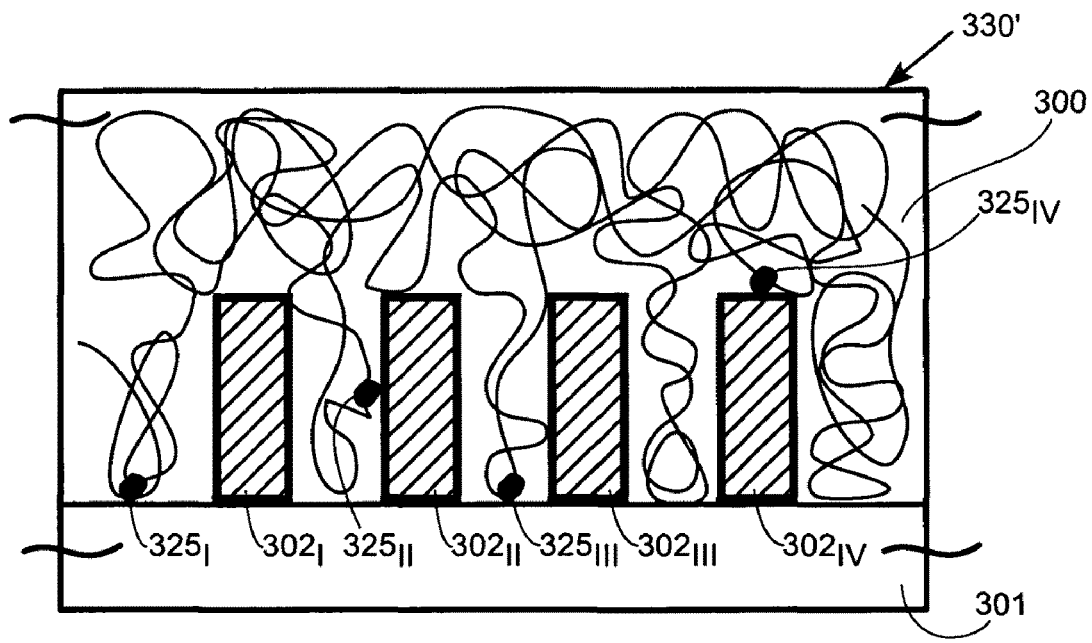
FIG. 3D shows the cleaning material of FIG. 3A dispensed on a patterned wafer to clean contaminants from the substrate surface, in accordance with one embodiment of the present invention.

The embodiment shown in FIG. 3C shows only one device structure 302. On a substrate, such as substrate 301, a number of device structures, such as $302_I$, $302_{II}$, $302_{III}$, and $302_{IV}$, can be clustered to be next to one another as shown in FIG. 3D, in accordance with one embodiment of the present invention. Similar to FIG. 3C, the liquid cleaning material 300, in the cleaning volume 330', is gentle on the device structures on the substrate during cleaning process. The polymers 310 in the cleaning material 300 slides around the device structures, $302_I$, $302_{II}$, $302_{III}$, and $302_{IV}$, without making a forceful impact on the device structures. Similar to the contaminants, $320_I$, $320_{II}$, $320_{III}$, and $320_{IV}$, of FIG. 3C being attached to polymer chains, contaminants, $325_I$, $325_{II}$, $325_{III}$, and $325_{IV}$, are also attached to polymers chains.

Figure 3E:
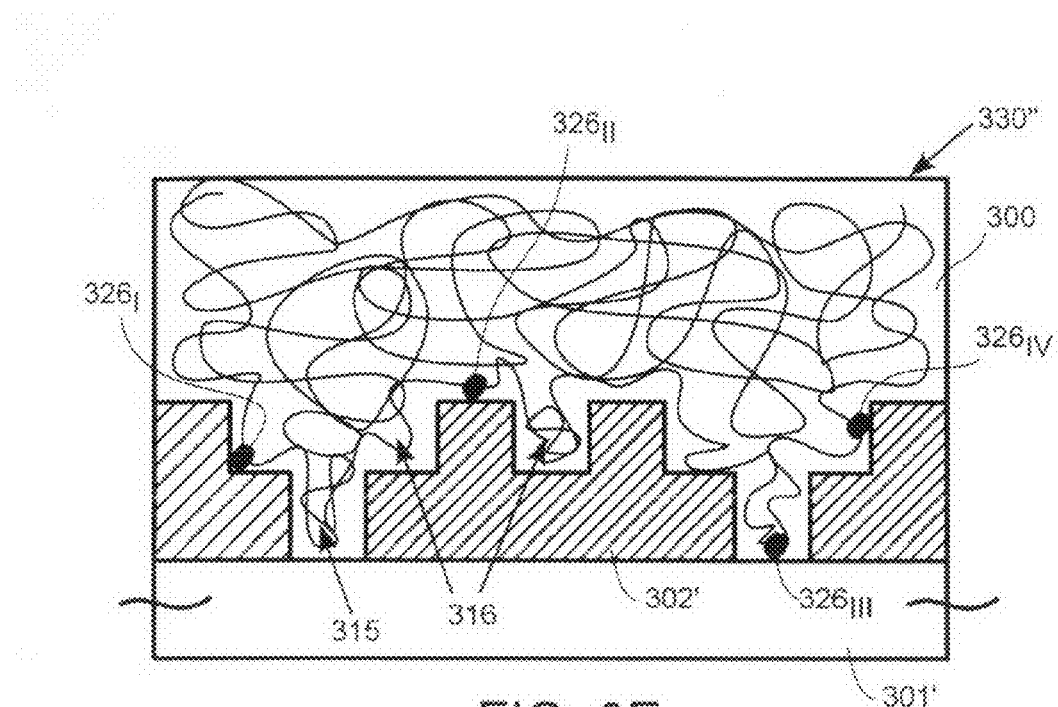
FIG. 3E shows the cleaning material of FIG. 3A dispensed on a patterned wafer with trenches and vias to clean contaminants from the substrate surface, in accordance with one embodiment of the present invention.

In addition to cleaning substrate with lines features, such as the ones in FIGS. 3C and 3D, substrates with other patterned features can also be cleaned by the materials and methods described in the current invention. FIG. 3E shows a substrate 301' with structures 302' that forms vias 315 and trenches 316, in accordance with one embodiment of the present invention. Contaminants $326_I$, $326_{II}$, $326_{III}$, and $326_{IV}$ can also be removed by cleaning material 300 by mechanisms discussed above in FIGS. 3C and 3D. In one embodiment, the polymers act as a flocculant that cause the particles (or contaminats) from the substrate surface to become floc, which is a mass formed by aggregation of fine suspended particles. In another embodiment, the polymers do not act as a flocculant.

As described above, the polymers of a polymeric compound with large molecular weight are dispersed in the cleaning solution. Examples of the polymeric compound with large molecular weight include, but not limited to, acrylic polymers such as polyacrylamide (PAM), and polyacrylic acid (PAA), such as Carbopol 940™ and Carbopol 941™, poly-(N,N-dimethyl-acrylamide) (PDMAAm), poly-(N-isopropyl-acrylamide) (PIPAAm), polymethacrylic acid (PMAA), polymethacrylamide (PMAAm); polyimines and oxides, such as polyethylene imine (PEI), polyethylene oxide (PEO), polypropylene oxide (PPO) etc; Vinyl polymers such as Polyvinyl alcohol (PVA), polyethylene sulphonic acid (PESA), polyvinylamine (PVAm), polyvinyl-pyrrolidone (PVP), poly-4-vinyl pyridine (P4VP), etc; cellulose derivatives such as methyl cellulose (MC), ethyl-cellulose (EC), hydroxyethyl cellulose (HEC), carboxymethyl cellulose (CMC), etc; polysaccharides such as acacia (Gum Arabic), agar and agarose, heparin, guar gum, xanthan gum, etc; proteins such as albumen, collagen, gluten, etc. To illustrate a few examples of the polymer structure, polyacrylamide is an acrylate polymer ($-CH_2CHCONH_2-$)n formed from acrylamide subunits. Polyvinyl alcohol is a polymer ($-CH_2CHOH-$)m formed from vinyl alcohol subunits. Polyacrylic acid is a polymer ($-CH_2=CH-COOH-$)o formed from acrylic acid subunits. "n", "m", and "o" are integers. The polymers of a polymeric compound with large molecular weight either is soluble in an aqueous solution or is highly water-absorbent to form a soft gel in an aqueous solution. In one embodiment, the molecular weight of the polymeric compound is greater than 100,000 g/mol. In another embodiment, the molecular weight of the polymeric compound is between about 0.1M g/mol to about 100M g/mol. In another embodiment, the molecular weight of the polymeric compound is between about 1M g/mol to about 20M g/mol. In yet another embodiment, the molecular weight of the polymeric compound is between about 15M g/mol to about 20M g/mol. The weight percentage of the polymers in the cleaning material is between about 0.001% to about 20%, in one embodiment. In another embodiment, the weight percentage is between about 0.001% to about 10%. In another embodiment, the weight percentage is between about 0.01% to about 10%. In yet another embodiment, the weight percentage is between about 0.05% to about 5%. The polymers can dissolve in the cleaning solution, be dispersed completely in the cleaning solution, form liquid droplets (emulsified) in the cleaning solution, or form lumps in the cleaning solution.

Alternatively, the polymers can be copolymers, which are derived from two or more monomeric species. For example, the copolymers can include 90% of PAM and 10% of PAA and are made of monomers for PAM and PAA. In addition, the polymers can be a mixture of two or more types of polymers. For example, the polymers can be made by mixing two types of polymers, such as 90% of PAM and 10% of PAA, in the solvent.

In the embodiments shown in FIGS. 3A-3C, polymers of a polymeric compound with large molecular weight are dissolved uniformly in the cleaning solution. The base liquid, or solvent, of the cleaning solution can be a non-polar liquid, such as turpentine, or a polar liquid such as water ($H_2O$). Other examples of solvent include isopropyl alcohol (IPA), dimethyl sulfoxide (DMSO), and dimethyl formamide (DMF). In one embodiment, the solvent includes more than one liquid and is a mixture of two or more liquid. For polymers with polarity, such as PAM, PAA, or PVA, the suitable solvent for the cleaning solution is a polar liquid, such as water ($H_2O$).

In another embodiment, the cleaning solution includes compounds other than the solvent, such as water, to modify the property of the cleaning material, which is formed by mixing the polymers in the cleaning solution. For example, the cleaning solution can include a buffering agent, which can be a weak acid or a weak base, to adjust the potential of hydrogen (pH) value of the cleaning solution and cleaning material formed by the cleaning solution. One example of the weak acid is citric acid. One example of the weak base is ammonium ($NH_4OH$). The pH values of the cleaning materials are between about 1 to about 12. In one embodiment, for front-end applications (before the deposition of copper and inter-metal dielectric), the cleaning material is basic. The pH values for front-end applications are between about 7 to about 12, in one embodiment. In another embodiment, the pH values for front-end applications are between about 8 to about 11. In yet another embodiment, the pH values for front-end applications are between about 8 to about 10. For backend processing (after deposition of copper and inter-metal dielectric), the cleaning solution is slightly basic, neutral, or acidic, in one embodiment. Copper in the backend interconnect is not compatible with basic solution with ammonium, which attacks copper. The pH values for backend applications are between about 1 to about 7, in one embodiment. In another embodiment, the pH values for backend applications are between about 1 to about 5. In yet another embodiment, the pH values for backend applications are between about 1 to about 2. In another embodiment, the cleaning solution includes a surfactant, such as ammonium dodecyl sulfate (ADS) to assist dispersing the polymers in the cleaning solution. In one embodiment, the surfactant also assist wetting of the cleaning material on the substrate surface. Wetting of the cleaning material on the substrate surface allows the cleaning material to come in close contact with the substrate surface and the particles on the substrate surface. Wetting improves cleaning efficiency. Other additives can also be added to improve surface wetting, substrate cleaning, rinsing, and other related properties.

Examples of buffered cleaning solution (or cleaning solution) include a buffered ammonium solution (BAS), which include basic and acidic buffering agents, such as 0.44 wt % of $NH_4OH$ and 0.4 wt % of citric acid, in the solution. Alternatively, the buffered solution, such as BAS, includes some amount of a surfactant, such as 1 wt % of ADS, to help suspend and disperse the polymers in the cleaning solution. A solution that contains 1 wt % of ADS, 0.44 wt % of NH3, and 0.4 wt % of citric acid is called solution "100". Both solution "100" and BAS have a pH value of about 10.

Figures 3F, 3G:
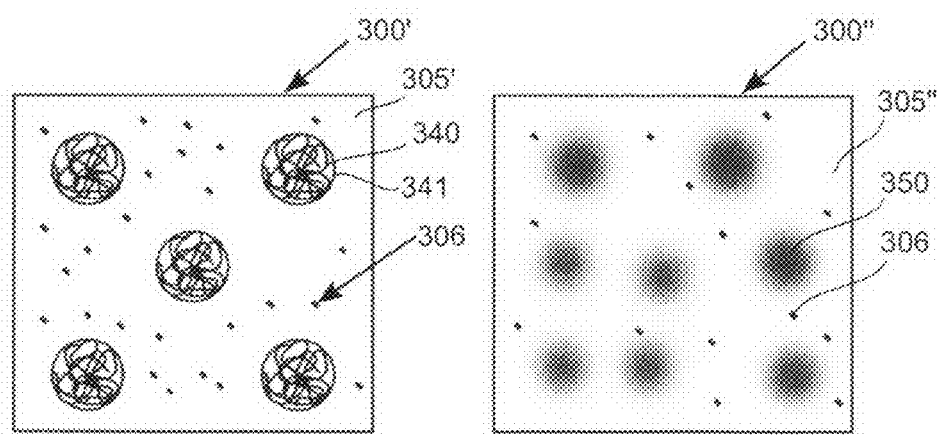
FIG. 3F shows a cleaning material with gel-like polymer droplets emulsified in the cleaning solution, in accordance with one embodiment of the present invention.
FIG. 3G shows a cleaning material with gel-like polymer lumps suspended in the cleaning solution, in accordance with one embodiment of the present invention.

The embodiments shown in FIGS. 3A-3E provide a liquid cleaning material 300 that has the polymers 310 with large molecular weight dispersed (or dissolved) uniformly in the cleaning solution 305. As described above, polymers with large molecular weight for this application are completely dissolved in the cleaning solution, which can be aqueous. The polymers are highly water-absorbent to form soft gel in an aqueous solution. FIG. 3F shows an embodiment of a liquid cleaning material 300' with gel-like polymer droplets 340 emulsified in the cleaning solution 305'. The cleaning solution 305' also contains small and isolated polymer 306. A surfactant, such as ADS, could be added to the cleaning solution to help the gel-like polymer droplets 340 being dispersed uniformly in the cleaning solution 305'. In the embodiment shown in FIG. 3F, there is a boundary 341 between the cleaning solution 305' and the gel-like polymer droplets 340. The gel-like polymer droplets 340 are soft and deform around device features on the substrate surface. Since the gel-like polymer droplets 340 deform around device features, they do not exert large energy (or force) on the device features to damage them. In one embodiment, the diameters of the droplets are between about 0.1 µm to about 100 µm.

In another embodiment, the polymers of a polymeric compound with large molecular weight dissolve in the cleaning solution to form gel-like polymer lumps 350, which do not establish a distinct boundary with the cleaning solution 305", as shown in FIG. 3G. The cleaning solution 305" also contains small and isolated polymer 306. The gel-like polymer lumps 350 are soft and deform around device features on the substrate surface, and do not exert large amount of energy (or force) on the device features on the substrate surface to damage them. In one embodiment, the diameters of the polymer lumps are between about 0.1 µm to about 100 µm.

Figure 3H:
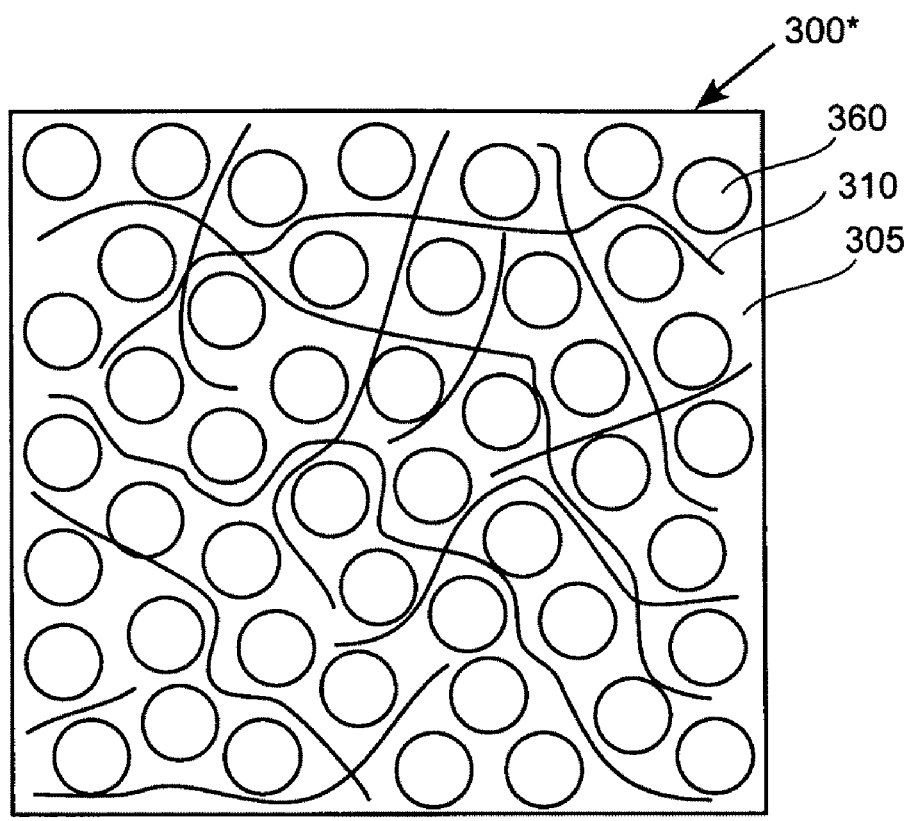
FIG. 3H shows a foam cleaning material, in accordance with one embodiment of the present invention.

The cleaning materials discussed above are all in liquid phase. In yet another embodiment, the cleaning material, such as liquid cleaning materials 300, 300', and 300" discussed above, can be agitated to add a gas, such as $N_2$, an inert gas, or a mixture of gases, such as air, to make the cleaning material into a foam, as shown in FIG. 3H. In FIG. 3H, the cleaning material 300* has air bubbles 360 dispersed in the cleaning solution 305. Polymers 310, is also dispersed in the cleaning solution 305. In other embodiments, the polymers 310 in FIG. 3H can be polymer droplets 340 or polymer lumps 350, described in FIGS. 3F and 3G. The cleaning material 300* has a gas phase and a liquid phase.

The cleaning material described above can be dispensed by many mechanisms on the substrate surface. As discussed above in FIGS. 2A and 2B, to avoid damaging device features on the patterned substrates, the energy applied by the cleaning material on the patterned surface needs to be below the minimum force $E_S$ or $E_S'$ to avoid damaging the device features. The cleaning materials, such as cleaning materials 300, 300', 300", and 300*, discussed above are either in liquid phase or in gas/liquid phases. Liquid and foam can flow on the substrate surface and deform (or flow) around the device features on the substrate surface. Therefore, the cleaning material can be applied on the patterned substrate without exerting large energy on the device features on the substrate surface.

Figure 4A:
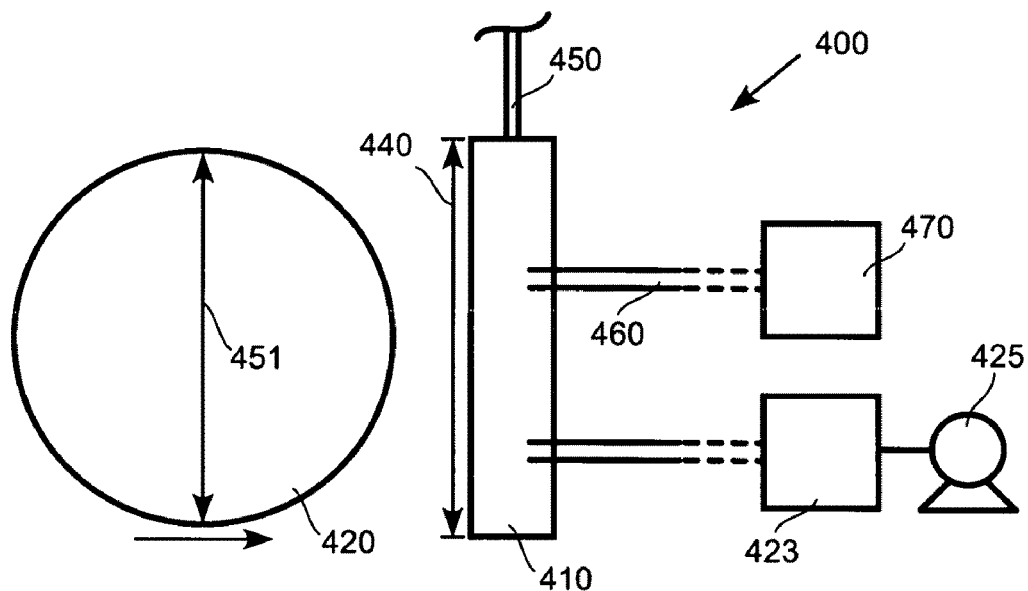
FIG. 4A shows a simplified schematic diagram of a top view of a system for cleaning a substrate in accordance with one embodiment of the invention.

FIG. 4A shows a simplified schematic diagram of a top view of a system 400 for cleaning a substrate in accordance with one embodiment of the invention. Wafer (or substrate) 420 moves in a linear direction toward a cleaning head 410 (or clean proximity head). The cleaning head is held by a support structure 450, which can be an arm. The cleaning head 410 provides (or dispenses) the cleaning material described above. In one embodiment, the length 440 of the cleaning head 410 is longer than the diameter 451 of the wafer 420. Wafer 420 is moved under the cleaning head only once. In another embodiment, the length 440 of the cleaning head 410 is shorter than the diameter 451 of the wafer 420. Wafer 420 is moved under the cleaning head 410 multiple times to ensure the entire wafer 420 has been cleaned.

In one embodiment, the cleaning material is delivered from a reservoir 470, which may be pressurized, through a supply line 460. Alternatively, the cleaning head 410 may move over wafer 420 while the wafer 420 is stationary or also moving. As described above, the cleaning material may be in the form of a liquid solution, a foam or an emulsion. If the reservoir 470 is pressurized, a cleaning solution or emulsion may be aerated and develop into a foam prior to being delivered to the cleaning head. Where the reservoir is not pressurized, the cleaning solution may be pumped or delivered through other commonly known means.

In one embodiment, the cleaning head is also coupled to a container 423 for used cleaning material vacuumed from the substrate surface and a vacuum pump 425 that provides the vacuum.

Figure 4B:
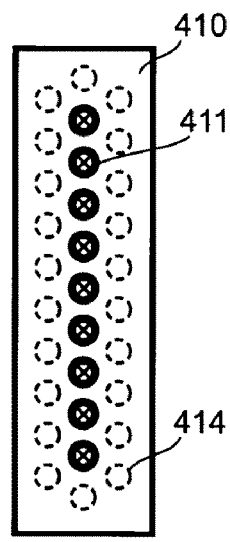
FIG. 4B shows a bottom view of the cleaning head with a number of dispensing holes to dispense the cleaning material, in accordance with one embodiment of the present invention.

FIG. 4B shows an exemplary bottom view of the cleaning head 410 with a number of dispensing holes 411 to dispense the cleaning material, in accordance with one embodiment of the present invention. Alternatively, the dispensing holes 411 are replaced with a long and narrow dispensing slot. In one embodiment, the (row of) dispensing holes 411 are surrounded by vacuum holes 414, which removes cleaning material from the substrate surface.

Figure 4C:
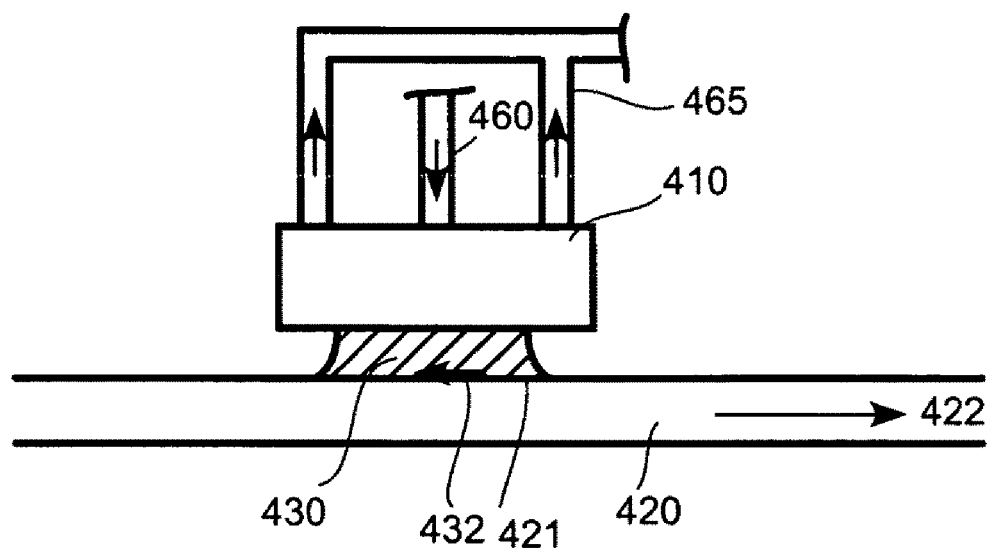
FIG. 4C shows a side view of the cleaning head dispensing a cleaning body of cleaning material under the cleaning head on a substrate surface, in accordance with one embodiment of the present invention.

FIG. 4C shows an embodiment of a side view of the cleaning head 410 dispensing a cleaning body 430 of cleaning material under the cleaning head 410 on a surface 421 of the wafer 420 to clean the surface 421. The cleaning material is supplied by supply line 460. The cleaning material is removed from the substrate surface by vacuum supplied by vacuum lines 465. The wafer 420 moves under the cleaning head 410 in a direction illustrated by the arrow 422. The cleaning body 430 of cleaning material forms a "meniscus." The term, "meniscus," as used herein, refers to the cleaning body (or volume) 430 of liquid bounded and contained in part by surface tension of the liquid. The meniscus is also controllable and can be moved over a surface in the contained shape. In specific embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller a computing system, which may be networked. Details of a dispensing head forming a meniscus on the surface of a substrate is discussed in U.S. patent application Ser. No. 11/641,362, filed on Dec. 18, 2006, entitled "Substrate Preparation Using Stabilized Fluid Solutions and Methods for Making Stable Fluid Solutions." The disclosure of the above-identified related application is incorporated herein by reference.

In one embodiment, the cleaning body 430 leaves behind a thin layer of cleaning material (not shown) on the surface 421 as the wafer 420 moves under the cleaning head 410. The thin layer of cleaning material is a result of cleaning material not completely removed by the vacuum. The cleaning head 410 is held in proximity to the surface 421 of wafer 420 by an arm 450. Therefore, the cleaning head 410 is called a proximity head. In one embodiment, the cleaning material dispensed from the cleaning head 410 exerts a shear force 432 on the surface 421 of the substrate under the cleaning body 430.

In another embodiment, the cleaning material dispensed from the cleaning head 410 also exerts a downward force (not shown) on the surface 421 of the substrate under the cleaning body 430. In one embodiment, the downward force and the shear force assist bringing the polymers in contact with the contaminants to allow the contaminants to be attached to the polymer chains and/or network. In one embodiment, the contaminants are attached to the polymers by van der Waals force. In another embodiment, the contaminants are entrapped by the polymeric network. In another embodiment, neither a downward force nor a shear force is needed in bringing the polymers in the cleaning solution to be in contact with the contaminants. When the cleaning material is dispersed on the substrate surface, polymers dispersed in the cleaning material would come in contact with contaminants on the substrate surface. During the rinsing step to remove cleaning material from the substrate surface, the contaminants attached and/or entrapped by the polymers are removed from the substrate surface along with the cleaning material.

Figure 4D:
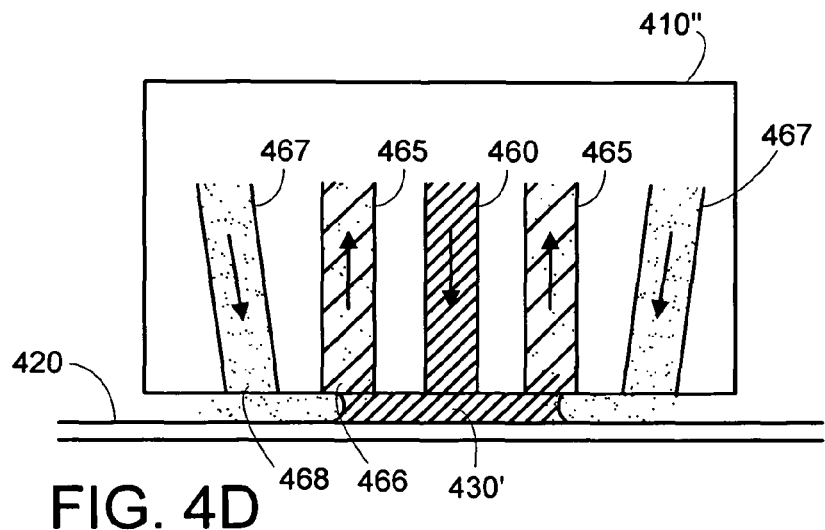
FIG. 4D shows a cross-sectional view of a cleaning head over a substrate, in accordance with one embodiment of the present invention.

FIG. 4D shows a cross-sectional view of a cleaning head 410" dispensing a cleaning material on a substrate 420. The cleaning material is dispensed through dispensing holes coupled to cleaning material supply line 460 and removed from the surface of substrate 420 by vacuum holes coupled to the vacuum lines 465. The cleaning material forms a meniscus 430' between the cleaning head 420 and the substrate 420. In addition, there are dispensing holes (not shown) of a surface tension reducing gas coupled to a supply line 467 of the surface tension reducing gas, which is used to reduce surface tension of the surface of substrate 420. In one embodiment, the surface tension reducing gas include a mixture of isopropyl alcohol (IPA) and nitrogen ($N_2$).

Figure 4E:
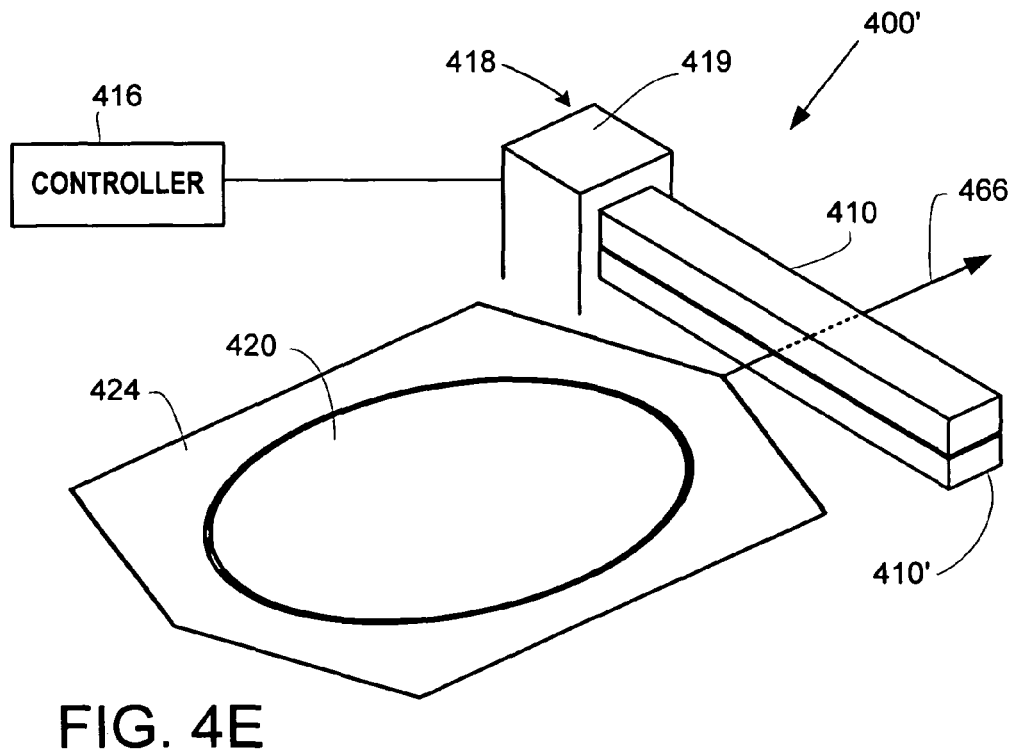
FIG. 4E shows a substrate cleaning system, in accordance with one embodiment of the present invention.

FIG. 4E shows an embodiment of a cleaning system 400' with a cleaning material dispensing assembly 418, which include an upper cleaning head (or proximity head) 410, a lower cleaning head (or proximity head) 410', and a support structure 419. The upper cleaning head 410' is a mirror image of the lower cleaning head 410'. The cleaning material dispensing assembly 418 is controlled by a controller 416. A substrate 420, being held by a substrate holder 424, passes between the upper and lower cleaning heads 410, 410' in the direction of 466. With the upper and the lower cleaning heads 410, 410', both the front and the back sides of the substrate are cleaned simultaneously.

Each cleaning head includes a plurality of dispensing holes (or nozzle) through which the cleaning material is supplied that forms meniscus 200. The liquid may be de-ionized water, a cleaning solution, or other liquid designed to process, clean, or rinse substrate 160. A plurality of vacuum ports 114 apply a vacuum at a perimeter of meniscus 200. Vacuum ports 114 aspirate liquid from meniscus 200 and surrounding fluid, such as air or other gas supplied by nozzles 112. In certain embodiments, nozzles 112 surround vacuum ports 114 and supply isopropyl alcohol vapor, nitrogen, a mixture thereof, or other gas or two-phase gas/liquid fluid. The nozzles 112 and fluid supplied therefrom aid in maintaining a coherent liquid/gas interface at the surface of meniscus 200. More details relating to proximity head structure and operation are incorporated by reference in the Cross Reference to Related Art section above. In particular, U.S. patent application Ser. Nos. 10/261,839, 10/330,843, and 10/330,897 are referenced for additional details relating to proximity head structure and operation.

Details of cleaning apparatus using a proximity head to dispense cleaning materials are described in U.S. patent application Ser. No. 11/532,491, filed on Sep. 15, 2006, entitled "Method and Material for Cleaning a Substrate," U.S. patent application Ser. No. 11/532,493, filed on Sep. 15, 2006, entitled "Apparatus and System for Cleaning a Substrate," and U.S. patent application Ser. No. 11/641,362, filed on Dec. 18, 2006, entitled "Substrate Preparation Using Stabilized Fluid Solutions and Methods for Making Stable Fluid Solutions." The disclosure of each of the above-identified related applications is incorporated herein by reference.

Figure 4F:
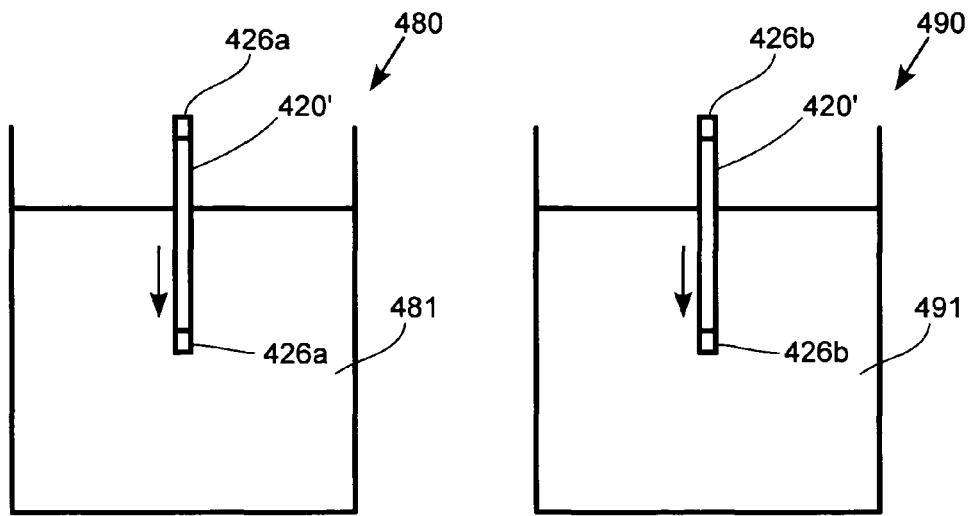
FIG. 4F shows a cleaning apparatus using the cleaning material containing polymers of a polymeric compound with large molecular weight to clean substrates and a rinsing apparatus to rinse off the cleaning material, in accordance with one embodiment of the present invention.

The embodiments described above are merely examples. Other embodiments of cleaning heads for dispensing cleaning material on the substrate surface and for removing cleaning material from the substrate surface are also possible. FIG. 4F shows a cleaning tank 480 containing cleaning material 481 and a rinsing tank 490 containing rinse liquid 491, in accordance with one embodiment of the present invention. Substrate 420', held by a substrate carrier 426a, is first dipped into the cleaning material 481 of tank 480 to allow the cleaning material to be in contact with the contaminants on the substrate surface. Substrate 420' is lowered into and raised out of the cleaning material 481 in cleaning tank 480 by a mechanical mechanism (not shown). Afterwards, the substrate 420', held by a substrate carrier 426b, is then dipped into the rinse liquid 491 of rinsing tank 490 to rinse off the cleaning material. A mechanical mechanism (not shown) is used to lower and raise the substrate into and out of the rinse tank 490. When the cleaning material leaves the surface of substrate 420' in rinse tank (or rinsing tank) 490, the contaminants are removed from the substrate surface along with the cleaning material. Substrate 420' is lowered into the rinse liquid 491 in rinse tank 490 by a mechanical mechanism (not shown). Although the orientation of the substrate shown in FIG. 4F is vertical, other orientation is also possible. For example, the substrate can be submerged in the cleaning tank and/or the rinse tank in a horizontal orientation.

Figure 4G:
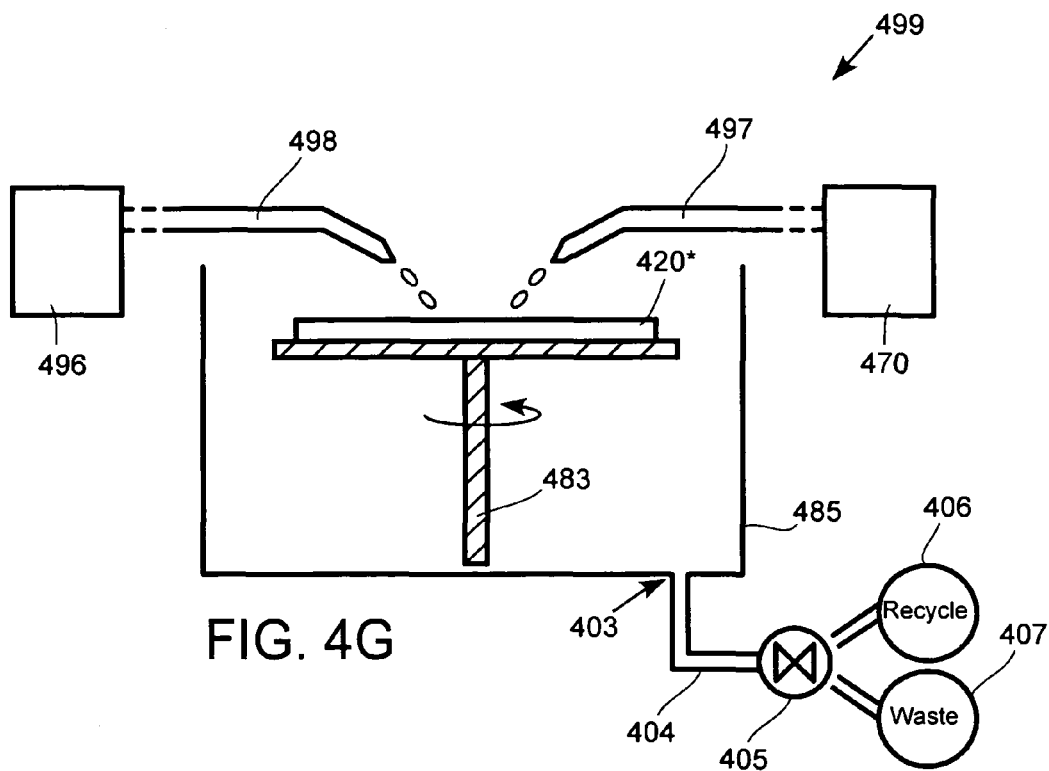
FIG. 4G shows a cleaning and rinsing apparatus using the cleaning material containing polymers of a polymeric compound with large molecular weight to clean substrates, in accordance with one embodiment of the present invention.

FIG. 4G shows another embodiment of a cleaning apparatus 499 for cleaning contaminants from the surface of the substrates. The cleaning apparatus has a cleaning tank 485 with a substrate support 483. Substrate 420* is placed on the substrate support 483, which rotates during the cleaning process. The cleaning apparatus 499 has a cleaning material dispensing head 497, which dispenses cleaning material on the surface of substrate 420*. The cleaning material dispensing head 497 (or a dispensing nozzle) is coupled to a storage tank 470 of cleaning material. The cleaning apparatus 499 also has a rinse liquid dispensing head 498 (or a dispensing nozzle), which sprays rinse liquid on the surface of the substrate 420". The rinse liquid dispensing head 498 is coupled to a storage tank 496 of the rinse liquid. The rotating substrate 420* allows the cleaning material and the rinse liquid to cover the entire substrate surface. The cleaning material is dispensed on the substrate surface before the rinse liquid is dispensed to remove the cleaning material from the substrate surface.

After the cleaning material is rinsed off the surface of the patterned substrate, the patterned substrate is dried by spinning (or rotating) the substrate at a relatively high speed. During the spinning, the substrate is secured by a device (or mechanism), which is not shown in FIG. 4G. In one embodiment, a surface tension reducing gas is applied on the surface of the patterned substrate to assist in removing the rinse and possibly residual cleaning material. In one embodiment, the surface tension reducing gas includes a mixture of isopropyl alcohol (IPA) and nitrogen ($N_2$). Other surface tension reducing gas can also be used.

The cleaning tank 485 can receive waste of the cleaning process. The waste of the cleaning process includes waste cleaning material and waste rinse liquid. In one embodiment, the cleaning tank 485 has a drainage hold 403, which is connected to a waste line 404. Waste line 404 is coupled to a valve 405, which controls the draining of cleaning waste from the cleaning tank 485. The cleaning waste can be directed to a recycling processor 406 or a waste processor 407.

The cleaning materials described above have special advantages in cleaning substrates with fine features (or topologies), such as polysilicon lines or metallic interconnects (with trenches and/or vias), on the substrate surface. The smallest width (or critical dimension) of these fine features can be 45 nm, 32 nm, 25 nm, or less. For advanced cleaning using cleaning materials described above, the cleaning materials need to come with as little metallic and/or particulate contaminants as possible. The metallic contaminants in the prepared cleaning material, before it is applied on the substrate surface, are specified to be less than 100 ppb (parts per billion) for all metallic contaminants, in one embodiment. In another embodiment, the metallic contaminants in the prepared cleaning material are specified to be less than 10 ppb (parts per billion). In yet another embodiment, the metallic contaminants in the prepared cleaning material are specified to be less than 1 ppb for advance cleaning. The particle specification for the prepared cleaning material, before it is applied on the substrate surface, is less than 50 for particle size grater than 65 nm, in one embodiment. In another embodiment, the particle specification is less than 20 for particle size greater than 65 nm. In another embodiment, the particle specification is less than 10 for particle size greater than 50 nm. In yet another embodiment, the particle specification is less than 5 for particle size greater than 30 nm. The specification for metallic contaminants and particles is more strict for more advanced technology with finer (or smaller) feature sizes.

A number of methods and systems can be used in making (or purifying) the cleaning material meet the metallic contamination specification. For example, metallic contaminants in the cleaning material can be removed (or cleaning material can be purified) by fractionation. In one embodiment, an alcohol is added to the aqueous solution of polymer. Since the polymer is much less soluble in the alcohol than in water, purer polymer would precipitate. In addition to the alcohol, acid can be added to the aqueous solution of polymer to assist in separating metal from the polymer. Acid can provide $H^+$ to replace metal ions, such as $Na^+$, attached to the polymer, which would assist in separating the metal from the polymer. Another method of removing metallic contaminants is by using ion exchange. The cleaning material is passed through a column packed with small particles of resin to exchange metal ions in the cleaning material with hydrogen ion provided by the column. The column if filled with acid, which provide hydrogen ions to replace metal ions, such as Na⁺. Na⁺ is only used as an example. Other metal ions can be removed by such methods and systems. Other methods can also be used to purify cleaning materials.

Figure 4H:
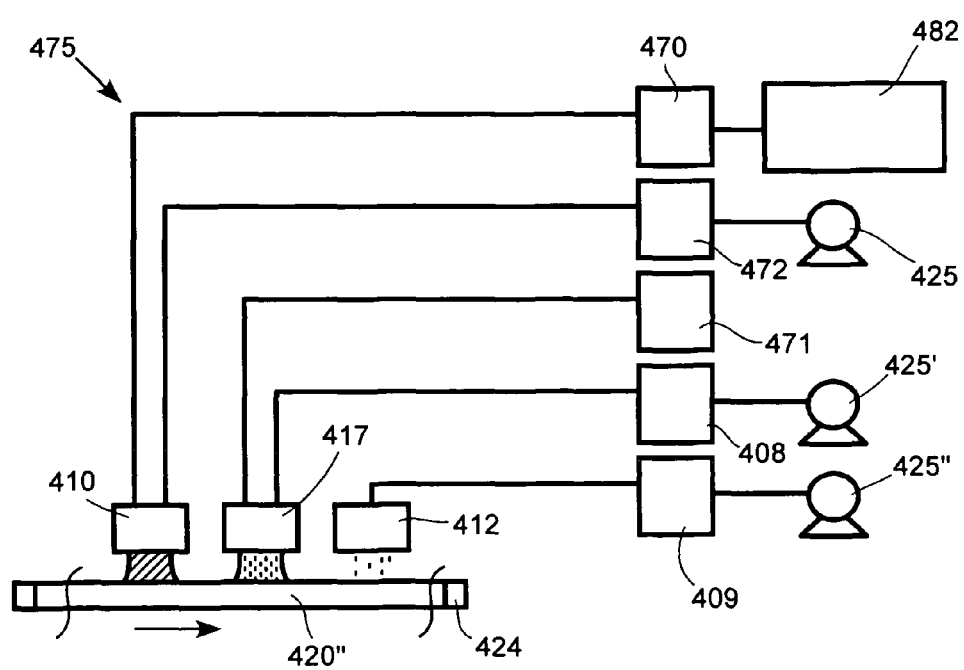
FIG. 4H shows a cleaning system, in accordance with one embodiment of the present invention.

FIG. 4H shows a schematic diagram of a system 475 for cleaning a substrate in accordance with one embodiment of the invention. The cleaning head 410 (or clean proximity head) is similar to the one shown in FIG. 4A. The substrate 420" is held by a substrate holder (or substrate carrier) 424. The cleaning head 410 is coupled to a reservoir 470 of cleaning material, such as cleaning material 300 discussed above. The cleaning head 410 is also coupled to a container 423 for used cleaning material, which is further coupled to a vacuum pump 425. In one embodiment, system 475 has a rinse head 417, which dispenses a rinse liquid to remove cleaning material from the surface of substrate 420". The rinse head 417 is coupled to a reservoir 471 of the rinse liquid. In one embodiment, the rinse head 417 is structured similarly to the cleaning head with rinse liquid dispensing holes and vacuum holes. The rinse head 417 is coupled to a container 408 of used rinse liquid, which is further coupled to a vacuum pump 425'. In another embodiment, system 475 has a vacuum head 412, which removes any remaining cleaning material and/or rinse liquid left on the substrate surface. The vacuum head is coupled to a waste container 409 of used cleaning material and rinse liquid. The waste container 409 is further coupled to a vacuum pump 425".

Figure 4I:
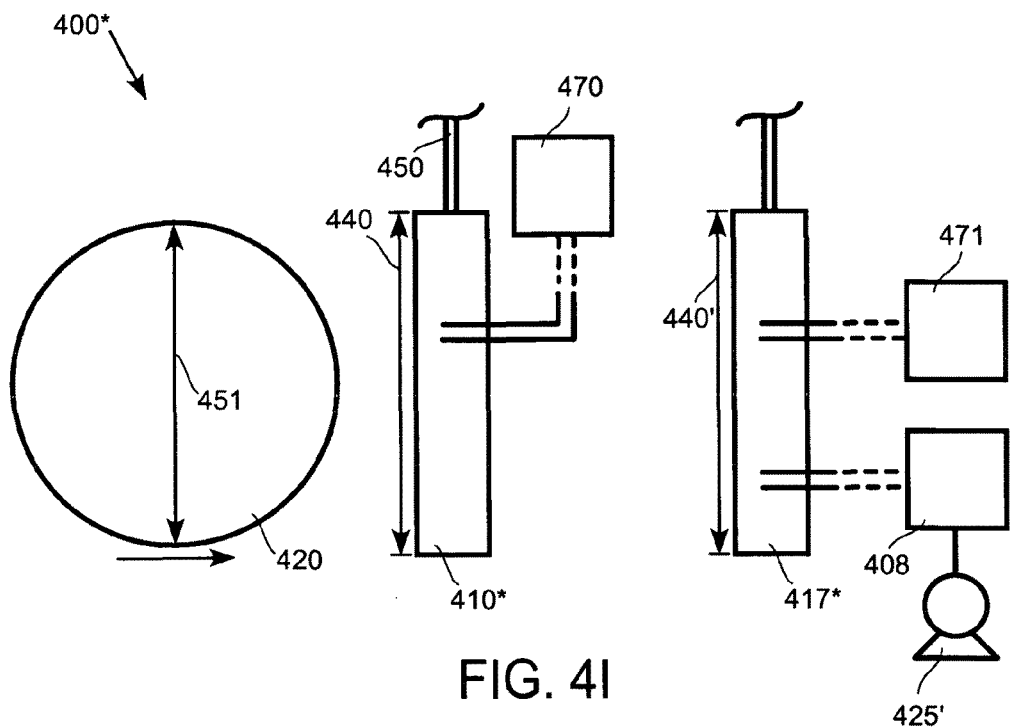
FIG. 4I shows a simplified schematic diagram of a top view of a system for cleaning a substrate in accordance with one embodiment of the invention.

FIG. 4I shows a top view of another cleaning system 400*, in accordance with one embodiment of the present invention. Wafer (or substrate) 420 moves in a linear direction toward a cleaning head 410*(or clean proximity head). The cleaning head is held by a support structure 450, which can be an arm. The cleaning head 410 is coupled to a reservoir 470 of cleaning material. The cleaning head 410* provides (or dispenses) the cleaning material described above. In one embodiment, the length 440 of the cleaning head 410* is longer than the diameter 451 of the wafer 420. Wafer 420 is moved under the cleaning head only once. In another embodiment, the length 440 of the cleaning head 410* is shorter than the diameter 451 of the wafer 420. Wafer 420 is moved under the cleaning head 410* multiple times to ensure the entire wafer 420 has been cleaned.

Figure 4J:
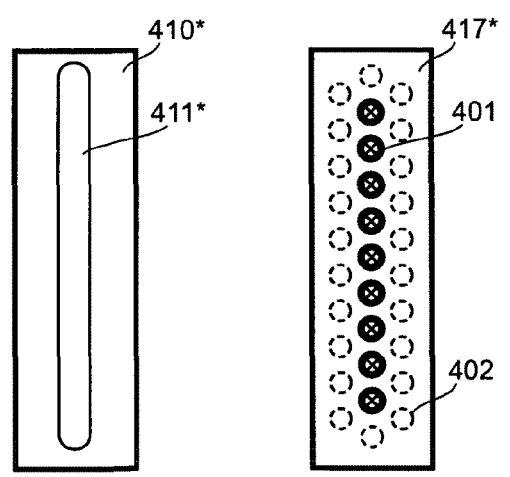
FIG. 4J shows a bottom view of the cleaning head and the rinse head of FIG. 4I, in accordance with one embodiment of the present invention.

In the embodiment of FIG. 4I, there is a rinsing head 417* next to the cleaning head 410*. Similar to cleaning head 410*, the length 440' of the rinse head 417* can be longer or shorter than the diameter 451 of the wafer. Wafer 420 moves under cleaning head 410* first and subsequently moves under rinsing head 417*. The cleaning head 410* includes a slit 411* to dispense cleaning material. FIG. 4J includes a bottom view of the cleaning head 410* with the slit 411*. The rinsing head 417* is coupled to a reservoir 471 of the rinse liquid. In one embodiment, the rinse head 417* is structured similarly to the cleaning head 410 of FIGS. 4A and 4B, with rinse liquid dispensing holes 401 and vacuum holes 402. FIG. 4J includes a bottom view of rinse head 417* with a number of rinse liquid dispensing holes 401, which are surrounded by a number of vacuum holes 402. The rinse head 417 is coupled to a container 408 of used rinse liquid, which is further coupled to a vacuum pump 425'.

When wafer 420 moves under cleaning head 410* and rinse head 417*, the cleaning head 410* dispenses cleaning material on the substrate surface and the rinse head 417* rinses the cleaning material off the surface of wafer 420. The rinse head 417* also removes the cleaning waste, which include particles and contaminants on the surface of wafer 420, cleaning material, and rinse liquid.

Figure 4K:
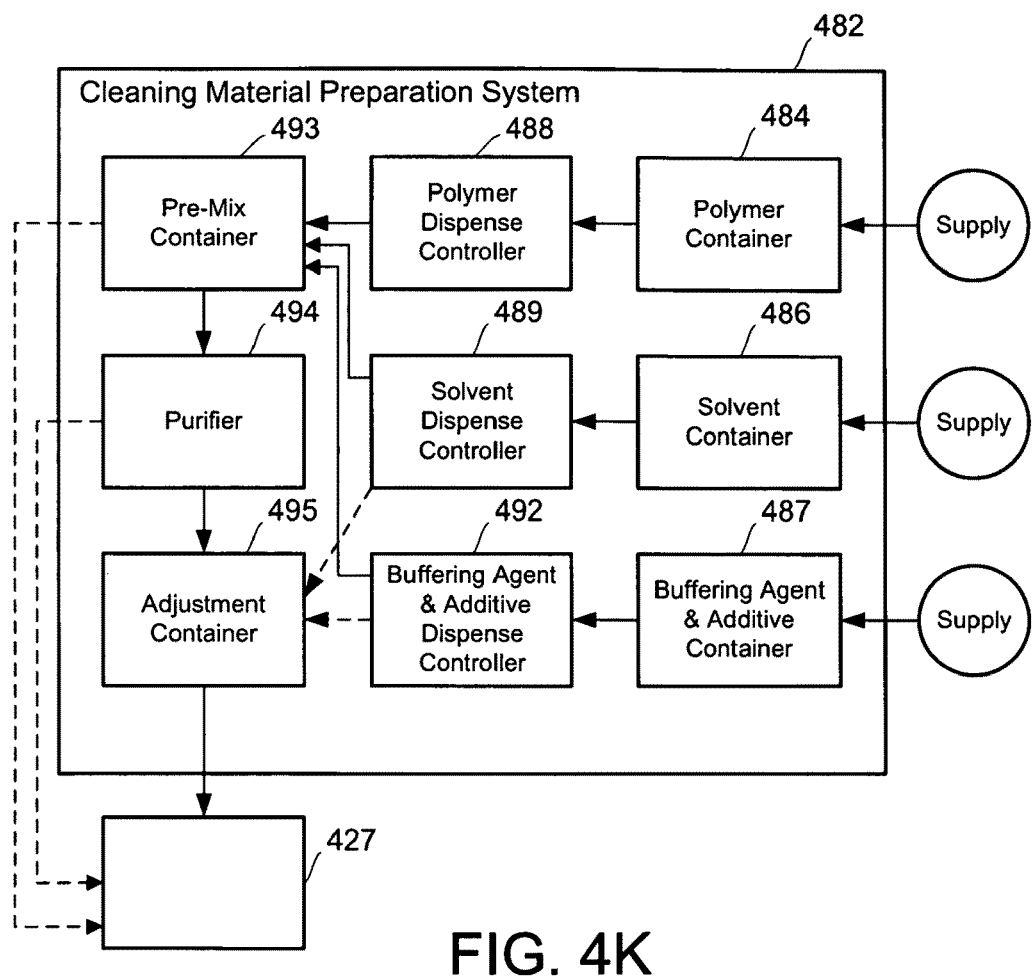
FIG. 4K shows a system for clean material preparation, in accordance with one embodiment of the present invention.

FIG. 4K shows a cleaning material preparation system 482, in accordance with one embodiment of the present invention. System 482 has a polymer container 484, which stores polymers used in the cleaning material. The polymer container 484 is further coupled to a dispense controller 488 that controls the amount of polymers being dispensed into a pre-mix container 493 in system 482. System 482 also has a solvent container 486, which stores solvent used in the cleaning material. The solvent container 486 is further coupled to a dispense controller 489 that controls the amount of solvent being dispensed into a pre-mix container 493 and to a cleaning material adjustment container 495 (will be further described below). In addition, system 482 has a buffering agent and additive container 487, which stores buffering agent and additive(s), such as a surfactant, used in the cleaning material. The buffering agent and additive container 487 is coupled to a dispense controller 492, which controls the amount of buffering agent and additive(s) being dispensed into the pre-mix container 493 and to the cleaning material adjustment container 495. In another embodiment, no additive is needed in the cleaning material and there is no additive in the buffering agent and additive container 487. In yet another embodiment, the buffering agent and the additive(s) are in separate containers and being controlled by separate controllers.

In one embodiment, the polymers, solvent, buffering agent, and additive(s) are first mixed in the pre-mix container 493. Afterwards, the mixture from container 493 is supplied to a purifier (or purifying system) 494 to remove metallic contaminants and other contaminants from the mixture. In one embodiment, the purifier 494 also has the function of filtering to filter out any particles (soft or abrasive) from the mixture. In another embodiment, only the polymers and the solvent are mixed in the pre-mix container 493. The buffering agent and the additives are not mixed in the pre-mixed container 493 with the polymers and the solvent.

After metallic contaminants have been removed, the mixture is moved to the adjustment container 495 for to add additional solvent, buffering agent, and additive(s) needed to make the final mixture of the cleaning material. The prepared cleaning material is stored in a container 427 for use in cleaning substrates. Alternatively, the mixture coming out of the purifier 494 is ready for use and does not need to be further processed in the adjustment container 495 for the cleaning material. Under such circumstances, the mixture coming out of the purifier 494 is the final cleaning material and is supplied to storage 427 of cleaning material. In another embodiment, the mixture from the pre-mix container 493 is ready to use and does not need to go through the purifier 494. Under such as circumstance, the mixture, which is the cleaning material, is supplied to the storage 427.

System 482 does not have the purifier 494 and the adjustment container 495, and the pre-mix container is a mixing container. Under such circumstance, the mixed cleaning material is supplied directly to the storage 427. In one embodiment, the cleaning material in cleaning material reservoir 470 of FIGS. 4A, 4E, 4G, 4H, and 4I is from storage 427 of cleaning material.

Table I compares the viscosity, rinse time, and particle removal efficiency (PRE) of different weight percent of Carbopol 941™ PAA in BAS. The viscosity is measured at strain rate of 500 s⁻¹. The rinse time measures the time it takes to rinse the cleaning material off the substrate surface. The PRE is measured by using particle monitor substrates, which are purposely deposited with silicon nitride particles with varying sizes. In this study, only particle sizes between 90 nm and 1 μm are measured. PRE is calculated by equation (1) listed below:

PRE=(Pre-clean counts−Post-clean counts)/Pre-clean counts    (1)

TABLE I

Comparison of cleaning material with different concentration of Carbopol 941 ™ PAA polymers

| Concentration (wt %) | Polymer molecular weight (g/mol) | Viscosity @ 500 s$^{-1}$ (cP) | Rinse Time (seconds) | PRE |
|---|---|---|---|---|
| 0.2% | 1.25 M | 26 | <5 | 74% |
| 0.5% | 1.25 M | 198 | 5-10 | 89% |
| 1% | 1.25 M | 560 | 8-10 | 87% |

The cleaning material of Table I is made by mixing Carbopol 941™ PAA, which is commercially available, in the BAS described above. The Carbopol 941™ PAA used has a molecular weight of 1,250,000 (or 1.25M) g/mol. The results in Table I show that PRE increases with weight % of Carbopol 941™ PAA until about 0.5%. There is no significant difference in PRE between 0.5% and 1% of polymers. The results also show that the viscosity of the cleaning material increases with the weight percentage of the polymers. In addition, the rinse time it takes to rinse off the cleaning material increases with the viscosity of the cleaning material. Water is used to rinse the substrate.

Table II compares the ability of different cleaning materials in entrapping or suspending particles in the cleaning materials. Silicon nitride particles are purposely added into the cleaning materials. After being added with silicon nitride particles, the cleaning materials are dispensed on clean substrates. The cleaning materials are then rinse off of the substrate, which is then measured for the number of particles (silicon nitride) on the surface.

TABLE II

Comparison of particle counts with different cleaning materials added with silicon nitride particles.

| Cleaning Material w/1X SiN particles | Particle counts after rinsing | Cleaning Material w/50X SiN particles | Particle counts after rinsing |
|---|---|---|---|
| DIW | Saturated | DIW | Saturated |
| DIW + ammonium (pH > 10) | 6002 | DIW + ammonium (pH > 10) | Saturated |
| "100" | 4238 | "100" | Saturated |
| 0.2% Carbopol 940 ™ in "100" | 1137 | 0.2% Carbopol 940 ™ in "100" | 15689 |
| 0.5% PAM in "100" | 53 | 0.5% PAM in "100" | 104 |

Five types of solutions are used as cleaning materials. The first type of cleaning material, "DIW", is de-ionized water. The second type of cleaning material is DIW added with ammonium to adjust the pH value to be greater than 10. The third type is solution "100", which is BAS added with 1 wt % of ADS. As mentioned above, the pH value of solution "100" is 10. The fourth type of cleaning material is 0.2 wt % of Carbopol 940™ PAA dissolved in "100" solution. The molecular weight of Carbopol 940™ PAA is 4M (or 4 million) g/mol. The fifth type is 0.5 wt % of PAM dissolved in solution "100". The molecular weight of PAM is 18M g/mol. The pH value of the fifth cleaning material is about 10. The five types of cleaning materials are mixed with two quantities of silicon nitride particles, 1×, and 50×. The number of silicon nitride particles of 50× is fifty times the number of particles of 1×. 1× nitride particles represent the nitride particle weight % is 0.00048%, while 50× nitride particle represent the nitride particle weight % is 0.024%.

The results show that DIW is not very good at suspending and keeping silicon nitride particle in DIW. Large amount of silicon nitride particles (saturated) are left on the substrate surface. The description of "saturated" used in Table II describes particle (or defects) counts of greater than 75,000. In contrast, 0.2% Carbopol 940™ PAA in "100" and 0.5% PAM in "100" are much better at suspending silicon nitride particles in the cleaning material. 0.5% PAM in "100" is especially good at entrapping or suspending silicon nitride particles added in the cleaning material. Only small numbers, 53 for 1× silicon nitride particles, and 104 for 50× silicon nitride particles, of silicon nitride (or $Si_3N_4$) particles in the cleaning material are left on the substrate surface.

Figure 5A:
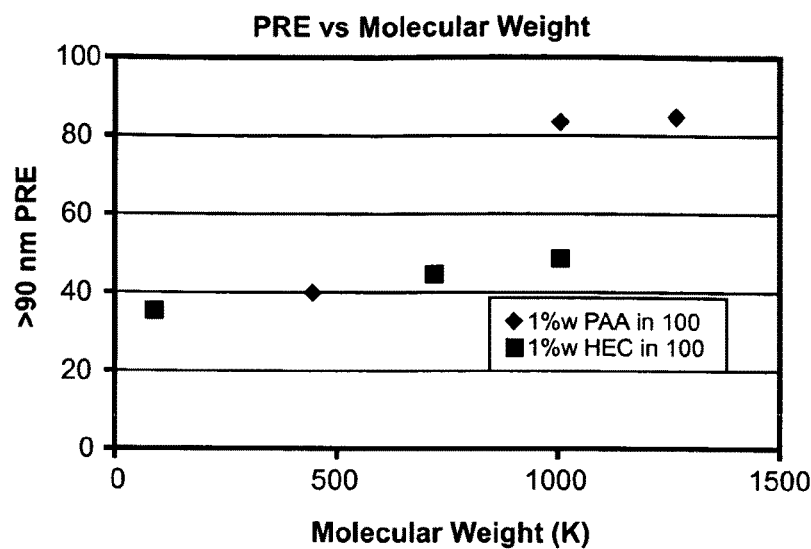
FIG. 5A shows particle removal efficiency (PRE) as a function of molecular weight for polyacrylic acid (PAA) and hydroxyethyl cellulose (HEC), in accordance with one embodiment of the present invention.
Figure 5B:
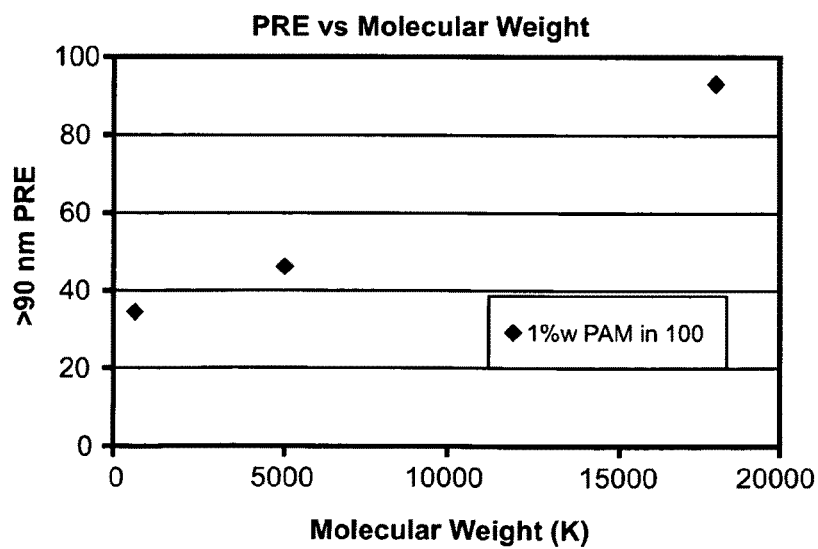
FIG. 5B shows PRE as a function of molecular weight for polyacrylamide (PAM), in accordance with one embodiment of the present invention.

The molecular weight of polymers used in the cleaning material can affect the particle removal efficiency (PRE). FIG. 5A shows a graph of PRE of greater than 90 nm Silicon nitride particles on a substrate by cleaning materials with 1% (weight %) of PAA in "100" and 1% (weight %) of hydroxyethyl cellulose (HEC) in "100" as a function of the molecular weight of these two polymers (PAA and HEC). The data in FIG. 5A show that PRE increases with molecular weight of HEC between 100,000 g/mol to 1M (or 1,000,000) g/mol. Data in FIG. 5A also show that PRE increases with molecular weight for PAA between 500,000 g/mol and 1M g/mol. However, PRE does not change much between 1M g/mol and 1.25M g/mol for PAA. FIG. 5B shows a graph of PRE of greater than 90 nm Silicon nitride particles on a substrate by cleaning materials with 1% (weight %) of PAM in "100" as a function of the molecular weight of PAM. The data in FIG. 5B show that increasing the PRE increases with molecular weight of PAM between 500,000 g/mol to 18M g/mol. Data in both graphs show the effects of molecular weight on PRE.

Figure 5C:
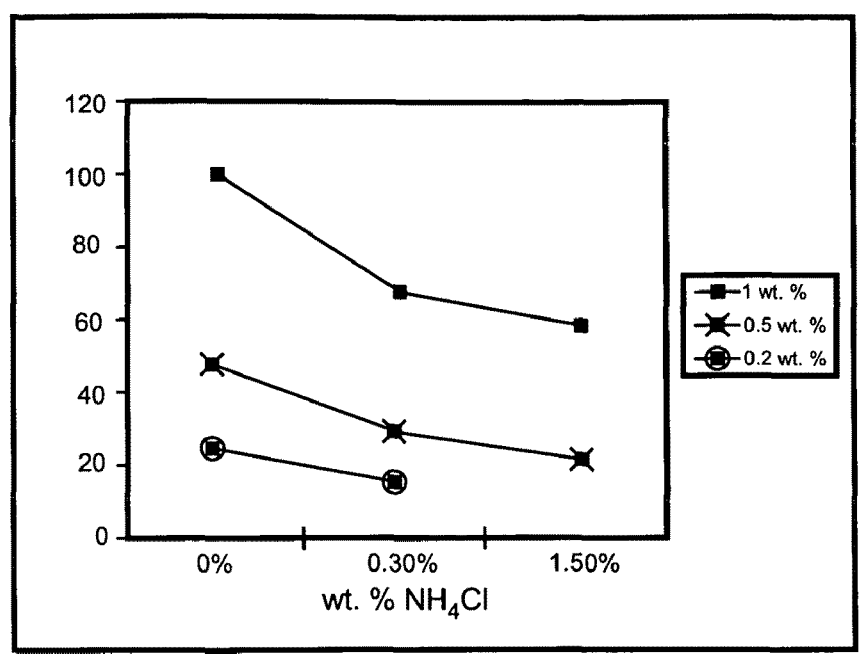
FIG. 5C shows experimental results of using ammonium chloride to reduce viscosity of cleaning material made with polyacrylamide (PAM) polymers, in accordance with one embodiment of the present invention.

As mentioned above, the viscosity of the cleaning material would affect the rinsing time to remove the cleaning material from the substrate surface. FIG. 5C shows the results of adding ammonium chloride ($NH_4Cl$) to cleaning material with 0.2 wt % −1 wt % of PAM dissolved in de-ionized (DI) water. The PAM has a molecular weight of 18M g/mol. The added ammonium chloride ionizes in the cleaning solution to provide additional ions to the cleaning material to increase the ionic strength of the cleaning material. The increased ionic strength reduces viscosity of the cleaning material. For example, 1.5 wt % of ammonium chloride is able to reduce the viscosity from about 100 cP to 60 cp for cleaning material with 1 wt % PAM. 1.5 wt % of ammonium chloride is also able to reduce the viscosity for cleaning material with 0.5 wt % PAM from about 50 cP to about 25 cP. Lowering the viscosity would lower the amount of time it takes to rinse the cleaning material from the substrate surface. In one embodiment, the viscosity of the cleaning material is dept below 500 cP to ensure substrate cleaning can be achieved within a reasonable time frame to achieve manufacturing goal.

Figure 6A:
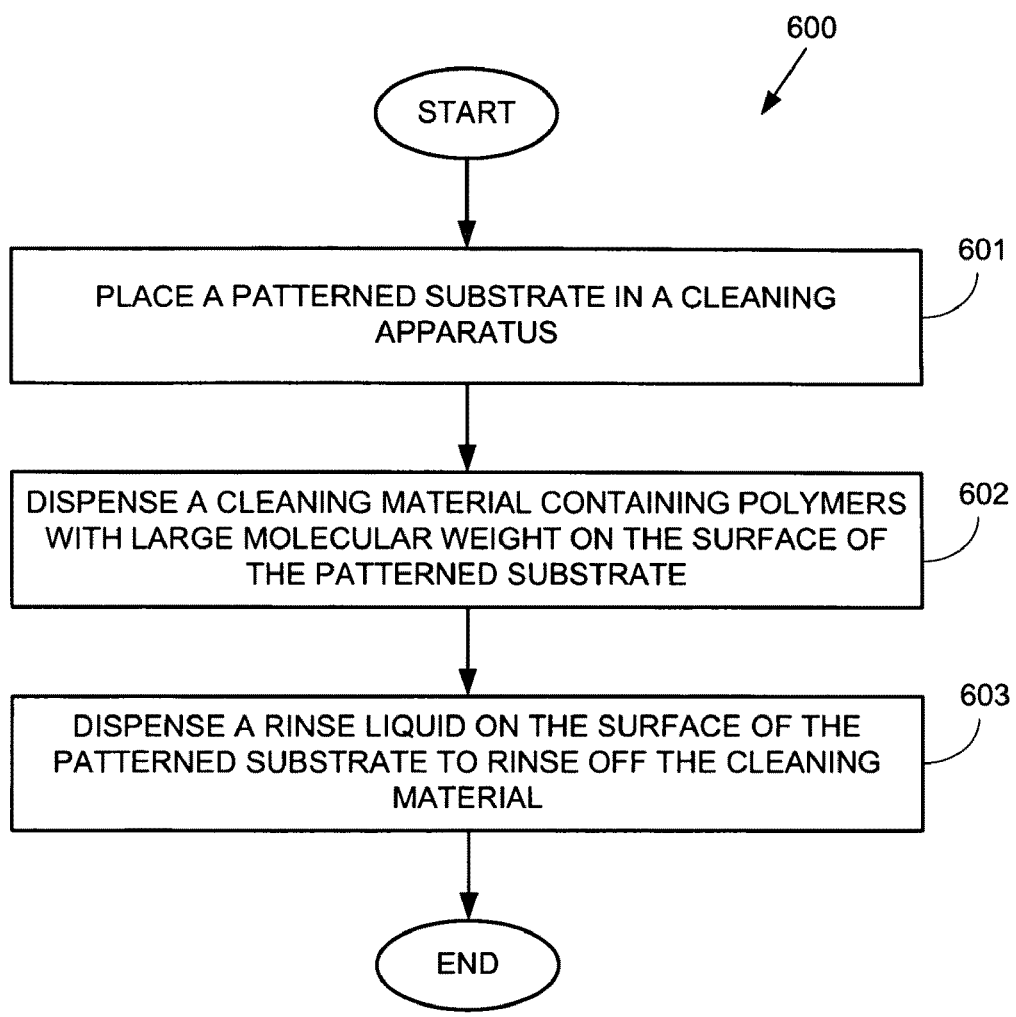
FIG. 6A shows a process flow of using the cleaning material containing polymers of a polymeric compound with high molecular weight to clean patterned substrates, in accordance with one embodiment of the present invention.

FIG. 6A shows a process flow 600 of cleaning a patterned substrate using a cleaning material containing polymers of a polymeric compound with large molecular weight, in accordance with one embodiment of the present invention. The cleaning material is described above. At step 601, the patterned substrate is place in a cleaning apparatus. At step 602, the cleaning material is dispensed on the surface of the patterned substrate. At step 603, a rinse liquid is dispensed on the surface of the patterned substrate to rinse off the cleaning material. The rinse liquid is described above. In one embodiment, after the rinse liquid is applied on the substrate surface, the rinse liquid, the cleaning material, and the contaminants on the substrate surface can be removed from the surface of the patterned substrate by vacuum.

Figure 6B:
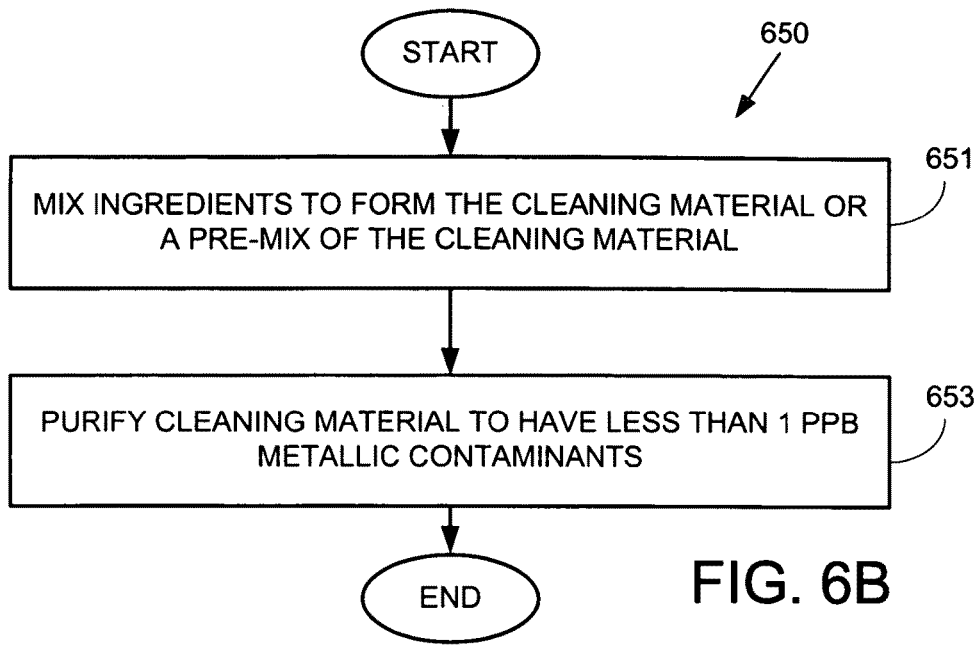
FIG. 6B shows a process flow of purifying cleaning material, in accordance with one embodiment of the present invention.

FIG. 6B shows a process flow 650 of preparing a cleaning material to clean a patterned substrate, in accordance with one embodiment of the present invention. The cleaning material containing polymers of a polymeric compound with large molecular weight as described above. At step 651, the materials, such as polymers, solvent, and additives (such as buffer agent, and/or surfactant), are mixed together to form the cleaning material, or a pre-mix of the cleaning material. At step 653, the cleaning material (or the pre-mix) is purified to have less than 1 ppb metallic contaminants. It is possible that after the purification process, some additive(s), solvent, and/or buffer agent need to be added to restore the cleaning material to the desired formula. Under such circumstance, the additives, solvent, and/or buffer agent are added to make the final product of cleaning material.

Figure 6C:
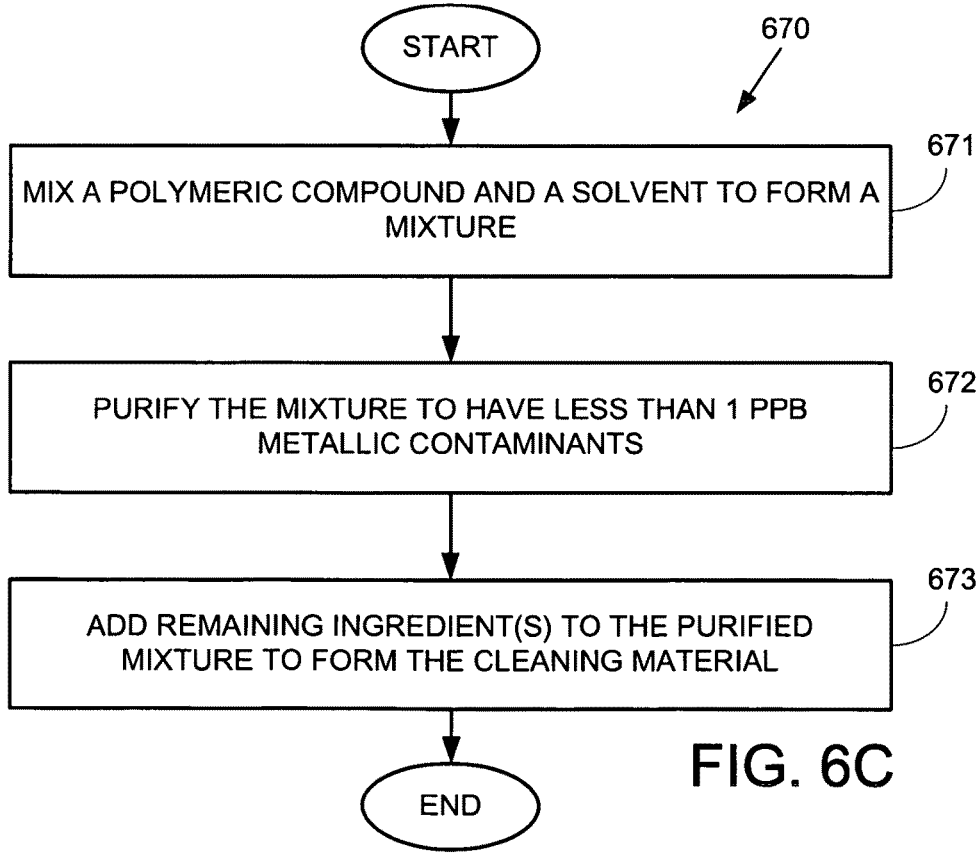
FIG. 6C shows a process flow of purifying cleaning material, in accordance with another embodiment of the present invention.

As discussed above, there are a number of methods for purifying the cleaning material to rid the cleaning material of metallic contamination. Alternatively, the purification can be performed during the cleaning material preparation process. FIG. 6C shows a process flow 670 of preparing a cleaning material to clean a patterned substrate, in accordance with another embodiment of the present invention. At step 671, the polymeric compound and some solvent is mixed together to form a mixture. At step 672, the mixture of polymer and solvent is purified to have less than 1 ppb metallic contaminants. At step 673, the mixture of polymer and solvent are mixed with the remaining ingredients to form the cleaning material. Other embodiments of purifying the cleaning material are also possible.

The cleaning materials, apparatus, and methods discussed above have advantages in cleaning patterned substrates with fine features without damaging the features. The cleaning materials are fluidic, either in liquid phase, or in liquid/gas phase (foam), and deform around device features; therefore, the cleaning materials do not damage the device features. The cleaning materials in liquid phase can be in the form of a liquid, a sol, or a gel. The cleaning materials containing polymers of a polymeric compound with large molecular weight capture the contaminants on the substrate. In addition, the cleaning materials entrap the contaminants and do not return the contaminants to the substrate surface. The polymers of a polymeric compound with large molecular weight form long polymer chains, which can also be cross-linked to form a network of polymers. The long polymer chains and/or polymer network show superior capabilities of capturing and entrapping contaminants, in comparison to conventional cleaning materials.

The cleaning material is substantially free of non-deformable particles (or abrasive particles), before it is applied on the substrate surface to remove contaminants or particles from the substrate surface. Non-deformable particles are hard particles, such as particles in a slurry or sand, and can damage fine device features on the patterned substrate. During the substrate cleaning process, the cleaning material would collect contaminants or particles from the substrate surface. However, no non-deformable particles have been intentionally mixed in the cleaning material before the cleaning material is applied on the substrate surface for substrate cleaning.

Although the embodiments above describe materials, methods, and systems for cleaning patterned substrates, the materials, methods, and systems can also be used to clean un-patterned (or blank) substrates.

Although the discussion above is centered on cleaning contaminants from patterned wafers, the cleaning apparatus and methods can also be used to clean contaminants from un-patterned wafers. In addition, the exemplary patterns on the patterned wafers discussed above are protruding lines, such as polysilicon lines or metal lines. However, the concept of the present invention can apply to substrates with recessed features. For example, recess vias after CMP can form a pattern on the wafer and a most suitable design of channels can be used to achieve best contaminant removal efficiency.

A substrate, as an example used herein, denotes without limitation, semiconductor wafers, hard drive disks, optical discs, glass substrates, and flat panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A cleaning material preparation system, comprising:
a polymer container, which contains polymers;
a solvent container, which contains a solvent;
a container for buffering agent, which contains a buffering agent;
a mixing container for preparing a first mixture of the polymers, the solvent, and the buffering agent to prepare the cleaning material, wherein the mixing container is coupled to the polymer container, the solvent container, and the container for the buffering agent; and
an adjustment container for preparing the cleaning material by mixing the first mixture with additional buffering agent, wherein the adjustment container is coupled to the mixing container, and wherein the cleaning material is for removing contaminants on a surface of a patterned substrate for defining integrated circuit devices, and wherein the cleaning material includes polymers of the polymeric compound with a molecular weight greater than 10,000 g/mol, the polymers being soluble in a solvent to form the cleaning material, the cleaning material having less than 1 part per billion (ppb) of metallic contaminants before being applied on the surface of the patterned substrate, the solubilized polymers having long polymer chains to capture and entrap the contaminants from the surface of the patterned substrate, wherein the cleaning material deforms around device features on the patterned substrate when a force is applied on the cleaning material applied on the surface of the patterned substrate to remove the contaminants without substantially damaging the device features on the surface, the cleaning material being substantially free of abrasive particles before the cleaning material being applied on the surface of the patterned substrate, the adjustment container being coupled to a storage of the cleaning material, which is coupled to the cleaning material preparation system.

2. The cleaning material preparation system of claim 1, wherein the container for buffering agent further contains additives to make the first mixture and the polymers, the solvent, the buffering agent and the additives are mixed together in the mixing container.

3. The cleaning material preparation system of claim 1, wherein the solvent is selected from the group consisting of water, isopropyl alcohol (IPA), dimethyl sulfoxide (DMSO), dimethyl formamide (DMF), or a combination thereof.

4. The cleaning material preparation system of claim 1, wherein the polymeric compound is selected from the group consisting of acrylic polymers, such as polyacrylamide (PAM), polyacrylic acid (PAA), such as Carbopol 940™ and Carbopol 941™, poly-(N,N-dimethyl-acrylamide) (PDMAAm), poly-(N-isopropyl-acrylamide) (PIPAAm), polymethacrylic acid (PMAA), polymethacrylamide (PMAAm), polyimines and oxides, such as polyethylene imine (PEI), polyethylene oxide (PEO), polypropylene oxide (PPO), vinyl polymers, such as polyvinyl alcohol (PVA), polyethylene sulphonic acid (PESA), polyvinylamine (PVAm), polyvinylpyrrolidone (PVP), poly-4-vinyl pyridine (P4VP), cellulose derivatives, such as methyl cellulose (MC), ethyl-cellulose (EC), hydroxyethyl cellulose (HEC), carboxymethyl cellulose (CMC), polysaccharides, such as acacia, agar and agarose, heparin, guar gum, xanthan gum, and proteins such as albumen, collagen, and gluten.

5. The cleaning material preparation system of claim 1, wherein the molecular weight is between about 0.1 M g/mol to about 100M g/mol.

6. The cleaning material preparation system of claim 1, wherein the cleaning material is fluidic in a form of a liquid, sol, gel, or foam.

7. The cleaning material preparation system of claim 1, further comprising a proximity head coupled to the storage of the cleaning material for dispensing the cleaning material on a substrate surface.

8. A cleaning material preparation system, comprising:
a polymer container, which contains polymers;
a solvent container, which contains a solvent;
a container for buffering agent and additives, which contains a buffer agent and additives for making the cleaning material;
a first mixing container for preparing a first mixture of the polymers, the solvent, the buffer agent, and the additives to make the cleaning material, wherein the mixing container is coupled to the polymer container, the solvent container, and the container for buffering agent and additives;
a purifier, which is a system that purifies the first mixture from the first mixing container, wherein the purifier is coupled to the first mixing container; and
an adjustment container for preparing the cleaning material by mixing the first mixture with additional buffering agent and additives, wherein the adjustment container is coupled to the purifier, and wherein the cleaning material is for removing contaminants on a surface of a patterned substrate for defining integrated circuit devices, and wherein the cleaning material includes polymers of the polymeric compound with a molecular weight greater than 10,000 g/mol, the polymers being soluble in a solvent to form the cleaning material, the cleaning material having less than 1 part per billion (ppb) of metallic contaminants before being applied on the surface of the patterned substrate, the solubilized polymers having long polymer chains to capture and entrap the contaminants from the surface of the patterned substrate, wherein the cleaning material deforms around device features on the patterned substrate when a force is applied on the cleaning material applied on the surface of the patterned substrate to remove the contaminants without substantially damaging the device features on the surface, the cleaning material being substantially free of abrasive particles before the cleaning material being applied on the surface of the patterned substrate, the adjustment container being coupled to a storage of the cleaning material, which is coupled to the cleaning material preparation system.

9. The cleaning material preparation system of claim 8, further comprising a proximity head coupled to the storage of the cleaning material for dispensing the cleaning material on a substrate surface.

10. The cleaning material preparation system of claim 8, wherein the purifier uses fractionation or ion exchange to remove metallic contaminants from the first mixture.

11. The cleaning material preparation system of claim 2, wherein the adjustment container further preparing the cleaning material by mixing the first mixture with additional additives.

* * * * *